United States Patent
Song et al.

(10) Patent No.: US 11,180,373 B2
(45) Date of Patent: Nov. 23, 2021

(54) NANOCRYSTALLINE GRAPHENE AND METHOD OF FORMING NANOCRYSTALLINE GRAPHENE

(71) Applicant: Samsung Electronics Co., Ltd., Suwon-si (KR)

(72) Inventors: Hyunjae Song, Hwaseong-si (KR);
Keunwook Shin, Yongin-si (KR);
Hyeonjin Shin, Suwon-si (KR);
Changseok Lee, Seoul (KR);
Changhyun Kim, Seoul (KR);
Kyungeun Byun, Seongnam-si (KR);
Seungwon Lee, Hwaseong-si (KR);
Eunkyu Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/183,146

(22) Filed: Nov. 7, 2018

(65) Prior Publication Data
US 2019/0161351 A1    May 30, 2019

(30) Foreign Application Priority Data

Nov. 29, 2017 (KR) .................. 10-2017-0161833
Aug. 13, 2018 (KR) .................. 10-2018-0094620

(51) Int. Cl.
*H01L 23/00* (2006.01)
*C01B 32/186* (2017.01)
(Continued)

(52) U.S. Cl.
CPC .......... *C01B 32/186* (2017.08); *C01B 32/182* (2017.08); *C23C 16/26* (2013.01);
(Continued)

(58) Field of Classification Search
CPC ......... H01L 21/28525; H01L 21/76843; H01L 23/53276; H01L 24/24
See application file for complete search history.

(56) References Cited

U.S. PATENT DOCUMENTS

| | | |
|---|---|---|
| 7,988,941 B2 | 8/2011 | Choi et al. |
| 8,476,765 B2 | 7/2013 | Zhang et al. |

(Continued)

FOREIGN PATENT DOCUMENTS

| | | |
|---|---|---|
| CN | 105585011 A | 5/1820 |
| CN | 103121670 A | 5/2013 |

(Continued)

OTHER PUBLICATIONS

Yong Seung Kim, Direct Integration of Polycrystalline Graphene into Light Emitting Diodes by Plasma-Assisted Metal-Catalyst-Free Synthesis, ACS nano, vol. 8, No. 3, 2230-2236, 2014.

(Continued)

*Primary Examiner* — Cuong Q Nguyen
(74) *Attorney, Agent, or Firm* — Harness, Dickey & Pierce, P.L.C.

(57) ABSTRACT

Provided are nanocrystalline graphene and a method of forming the nanocrystalline graphene through a plasma enhanced chemical vapor deposition process. The nanocrystalline graphene may have a ratio of carbon having an $sp^2$ bonding structure to total carbon within the range of about 50% to 99%. In addition, the nanocrystalline graphene may include crystals having a size of about 0.5 nm to about 100 nm.

16 Claims, 19 Drawing Sheets

(51) Int. Cl.

| | |
|---|---|
| *H01L 23/532* | (2006.01) |
| *H01L 21/285* | (2006.01) |
| *H01L 21/768* | (2006.01) |
| *C23C 16/26* | (2006.01) |
| *C23C 16/50* | (2006.01) |
| *H01L 27/24* | (2006.01) |
| *C01B 32/182* | (2017.01) |
| *B82Y 30/00* | (2011.01) |
| *B82Y 40/00* | (2011.01) |

(52) U.S. Cl.
CPC ........ *C23C 16/50* (2013.01); *H01L 21/28525* (2013.01); *H01L 21/76843* (2013.01); *H01L 23/53276* (2013.01); *H01L 27/24* (2013.01); *B82Y 30/00* (2013.01); *B82Y 40/00* (2013.01); *C01B 2204/26* (2013.01); *C01B 2204/30* (2013.01); *C01P 2002/60* (2013.01); *C01P 2002/85* (2013.01); *C01P 2006/10* (2013.01); *H01L 23/53238* (2013.01); *H01L 23/53266* (2013.01)

(56) References Cited

U.S. PATENT DOCUMENTS

| | | |
|---|---|---|
| 8,808,810 B2 | 8/2014 | Veerasamy |
| 9,306,005 B2 | 4/2016 | Byun et al. |
| 9,371,234 B2 | 6/2016 | Hong et al. |
| 9,472,450 B2 | 10/2016 | Bonilla et al. |
| 9,499,408 B2 | 11/2016 | Rieken |
| 9,543,156 B1 | 1/2017 | Hu |
| 10,738,377 B2 | 8/2020 | Matsumoto |
| 2004/0253167 A1 | 12/2004 | Silva et al. |
| 2007/0082488 A1 | 4/2007 | Katou |
| 2011/0117328 A1 | 5/2011 | Ivanov |
| 2011/0143045 A1 | 6/2011 | Veerasamy |
| 2012/0021249 A1 | 1/2012 | Shin et al. |
| 2012/0138903 A1 | 6/2012 | Chung et al. |
| 2012/0139114 A1 | 6/2012 | Zhang et al. |
| 2012/0141799 A1 | 6/2012 | Kub et al. |
| 2012/0147147 A1 | 6/2012 | Park et al. |
| 2012/0261644 A1 | 10/2012 | Dimitrakopoulos |
| 2013/0001515 A1 | 1/2013 | Li et al. |
| 2013/0130011 A1 | 5/2013 | Hong et al. |
| 2013/0187097 A1 | 7/2013 | Hong et al. |
| 2013/0192461 A1 | 8/2013 | Miller et al. |
| 2013/0299988 A1 | 11/2013 | Bonilla et al. |
| 2013/0321584 A1 | 12/2013 | Choi |
| 2014/0145332 A1 | 5/2014 | Ryan et al. |
| 2014/0272195 A1 | 9/2014 | McAlister |
| 2014/0353722 A1 | 12/2014 | Zhang et al. |
| 2015/0013593 A1 | 1/2015 | Dong |
| 2015/0091175 A1 | 4/2015 | Chandhok et al. |
| 2015/0235847 A1 | 8/2015 | Beasley et al. |
| 2015/0235959 A1 | 8/2015 | Lee et al. |
| 2016/0064489 A1 | 3/2016 | Zhang et al. |
| 2016/0068397 A1 | 3/2016 | Su et al. |
| 2016/0075560 A1 | 3/2016 | Kagaya et al. |
| 2016/0240482 A1 | 8/2016 | Song et al. |
| 2016/0270237 A1 | 9/2016 | Cho et al. |
| 2016/0339160 A1* | 11/2016 | Bedworth ............ B01D 61/243 |
| 2016/0365585 A1 | 12/2016 | Kamepalli et al. |
| 2017/0033003 A1 | 2/2017 | Song et al. |
| 2017/0125320 A1 | 5/2017 | Sung et al. |
| 2017/0152146 A1 | 6/2017 | Kim et al. |
| 2017/0154701 A1* | 6/2017 | Lee .................... B22F 1/0025 |
| 2017/0221996 A1 | 8/2017 | Park et al. |
| 2018/0057933 A1 | 3/2018 | Ifuku et al. |
| 2018/0149966 A1 | 5/2018 | Shin et al. |
| 2018/0187298 A1 | 7/2018 | Matsumoto |
| 2019/0096801 A1 | 3/2019 | Yang et al. |
| 2019/0108948 A1* | 4/2019 | Chai .................... D01F 9/12 |
| 2019/0144283 A1 | 5/2019 | Jakobsen et al. |
| 2019/0161351 A1 | 5/2019 | Song et al. |
| 2019/0285548 A1* | 9/2019 | Nunney ............... G01J 3/0291 |
| 2019/0345610 A1 | 11/2019 | Song et al. |
| 2020/0039827 A1 | 2/2020 | Jung et al. |
| 2020/0071233 A1* | 3/2020 | Joo .................... C04B 35/62272 |
| 2020/0105524 A1 | 4/2020 | Shin et al. |
| 2020/0140279 A1 | 5/2020 | Shin et al. |
| 2020/0286732 A1 | 9/2020 | Shin et al. |
| 2020/0350164 A1 | 11/2020 | Lee et al. |
| 2020/0354829 A1 | 11/2020 | Song et al. |

FOREIGN PATENT DOCUMENTS

| | | |
|---|---|---|
| CN | 103572247 A | 2/2014 |
| CN | 103121670 B | 4/2015 |
| JP | 2013249530 A | 12/2013 |
| JP | 2014-170826 A | 9/2014 |
| KR | 20120012271 A | 2/2012 |
| KR | 20120059853 A | 6/2012 |
| KR | 101312454 B1 | 9/2013 |
| KR | 101313746 B1 | 10/2013 |
| KR | 2014-0005470 A | 1/2014 |
| KR | 101381008 B1 | 4/2014 |
| KR | 2014-0090333 A | 7/2014 |
| KR | 10-2015-0012251 A | 2/2015 |
| KR | 101493893 B1 | 2/2015 |
| KR | 2015-0082197 A | 7/2015 |
| KR | 10-2015-0098180 A | 8/2015 |
| KR | 2015-0116570 A | 10/2015 |
| KR | 20150121680 A | 10/2015 |
| KR | 2016-0059468 A | 5/2016 |
| KR | 20160085418 A | 7/2016 |
| KR | 10-2016-0112245 A | 9/2016 |
| KR | 20180025819 A | 3/2018 |
| WO | WO-2015022500 A1 | 2/2015 |
| WO | WO-2015149116 A1 | 10/2015 |

OTHER PUBLICATIONS

Extended European Search report dated Dec. 20, 2019, issued in corresponding European Patent Application No. 19171635.6.
European Search Report dated Mar. 29, 2019, issued in corresponding European Patent Application No. 18206535.9.
Wang et al., "Synthesis of graphene on a polycrystalline Co film by radio-frequency plasma-enhanced chemical vapour deposition" J.Phys. D:Appl.Phys. 43 (2010) 455402.
Liu et al., "Two-step growth of graphene with separate controlling nucleation and edge growth directly on $SiO_2$ substrates" Carbon 72 (2014) pp. 387-392.
Kim et al., "Direct growth of patterned graphene on $SiO_2$ substrates without the use of catalysts or lithography" Nanoscale (2014) 6, pp. 10100-10105.
Office Action dated Apr. 9, 2020, received in co-pending U.S. Appl. No. 16/215,899.
Office Action from the Korean Patent Office dated Jun. 11, 2018 for KR Appl. No. 10-2017-0161833.
Extended European Search Report dated Jul. 31, 2019, issued in corresponding European Patent Application No. 18212973.4.
Extended European Search report dated Aug. 7, 2019, issued in corresponding European Patent Application No. 18206535.9.
Y, Wang et al., 'Toward High Throughput Interconvertible Graphane-to-Graphene Growth and Patterning'. *ACS Nano*, vol. 4, No. 10, 2010, pp. 6146-6152.
Z. Luo et al., 'Thickness-Dependent Reversible Hydrogenation of Graphene Layers'. *ACS Nano*, vol. 3, No. 7, 2009, pp. 1781-1788.
L. Pedrazzetti et al., 'Growth and characterization of ultrathin carbon films on electrodeposited Cu and Ni'. *Surface and Interface Analysis*, vol. 49, 2017, pp. 1088-1094.
"Graphene", Scientific Background on the Nobel Prize in Physics 2010, compiled by the Class for Physics of the Royal Swedish Academy of Sciences.
Office Action dated Sep. 21, 2020, received in corresponding U.S. Appl. No. 16/215,899.
Notice of Preliminary Examination Result dated Mar. 20, 2018, issued in corresponding Korean Patent Application No. KR 10-2017-0161833.

(56) References Cited

OTHER PUBLICATIONS

Menglin Li et al., 'Controllable Synthesis of Graphene by Plasma-Enhanced Chemical Vapor Deposition and Its Related Applications' *Advanced Science* 2016, 3, 1600003.
Notice of Allowance dated Dec. 9, 2020, received in corresponding U.S. Appl. No. 16/215,899.
Office Action dated Nov. 3, 2020, received in corresponding U.S. Appl. No. 16/884,590.
Office Action dated Jul. 10, 2020, received in corresponding U.S. Appl. No. 16/884,590.
Richard J. Lewis, Sr., editor; Hawley's Condensed Chemical Dictionary; 12th edition; Van Nostrand Reinhold Company, New York; 1993; pp. 3, 25, 254, and 994-995.
Office Action dated Jul. 17, 2020, received in corresponding U.S. Appl. No. 16/244,906.
U.S. Appl. 16/244,906, filed Jan. 10, 2019.
U.S. Appl. 16/215,899, filed Dec. 11, 2018.
U.S. Appl. 16/260,403, filed Jan. 29, 2019.
Guizhen Wang et al., 'High densities of magnetic nanoparticles supported on graphene fabricated by atomic layer deposition and their use as efficient synergistic microwave absorbers' *Nano Research*, 7(5), Feb. 2014, pp. 704-716, DOI 10.1007/s12274-014-0432-0.
Yijun Zhang et al. 'Low-Temperature Remote Plasma-Enhanced Atomic Layer Deposition of Graphene and Characterization of its Atomic-Level Structure' *Journal of Materials Chemistry C*, 2, 2014, pp. 7570-7574.
Notice of Allowance dated Jun. 23, 2021, received in corresponding U.S. Appl. No. 16/244,906.
Office Action dated Dec. 24, 2020, received in corresponding U.S. Appl. No. 16/260,403.
"Allotropes of Carbon", Introduction to Chemistry: nonmetallic elements; 10 pages; retrieved from the Internet Jan. 14, 2021 from ://courses.lumenlearning.com/introchem/chapter/allotropes-of-carbon/#:~:text = there are several allotropes of walled carbon nanotubes%2C or b . . . .
"6.3 Forms of Crystalline Carbon"; flex books 2.0, CK-12 Physical Science for Middle School; 7 pages; last modified July 3, 2019, retrieved from the Internet Jan. 14, 2021 from ://flexbooks.CK12.org/cbook/CK-12-middle-school-physical-science-flex-book-2.0/section/6.3/primary/lesson/crystalline-carbon-ms-ps.
Office Action dated Feb. 1, 2021, received in corresponding U.S. Appl. No. 16/244,906.
Machine translation CN 103572247 A (published Feb. 12, 2014) via ESpaceNet.
Notice of Allowance dated Apr. 9, 2021, received in corresponding U.S. Appl. No. 16/260,403.
Office Action dated Apr. 14, 2021, received in corresponding U.S. Appl. No. 16/884,590.

\* cited by examiner

NANOCRYSTALLINE GRAPHENE AND METHOD OF FORMING NANOCRYSTALLINE GRAPHENE

CROSS-REFERENCE TO RELATED APPLICATIONS

This application claims the benefit of Korean Patent Application Nos. 10-2017-0161833 and 10-2018-0094620, respectively filed on Nov. 29, 2017 and Aug. 13, 2018, in the Korean Intellectual Property Office, the disclosures of which are incorporated herein in their entirety by reference.

BACKGROUND

1. Field

The present disclosure relates to a graphene product including nanocrystalline graphene and a method of forming the nanocrystalline graphene, and more particularly, to nanocrystalline graphene and a method of growing the nanocrystalline graphene directly on a substrate via a plasma enhanced chemical vapor deposition (PECVD) method without using a catalyst.

2. Description of Related Art

Graphene is a crystalline material having a hexagonal honeycomb-like structure formed by two-dimensionally connected carbon atoms, and the thickness of graphene is very small, that is, graphene has an atom-size thickness. Such graphene may be synthesized via chemical vapor deposition (CVD) or may be obtained by exfoliating graphite layer by layer.

SUMMARY

Provided are nanocrystalline graphene and a method of growing the nanocrystalline graphene directly on a surface through a plasma enhanced chemical vapor deposition (PECVD) process. A graphene product may include the nanocrystalline graphene.

Additional aspects will be set forth in part in the description which follows and, in part, will be apparent from the description, or may be learned by practice of the presented embodiments.

According to some example embodiments, a graphene product includes a nanocrystalline graphene. The nanocrystalline graphene may include nano-sized crystals and may have a ratio of carbon having an $sp^2$ bonding structure to total carbon within a range of about 50% to about 99%.

In some example embodiments, a size of the nano-sized crystals may range about 0.5 nm to about 100 nm. The nanocrystalline graphene may include hydrogen in an amount of about 1 at % (atomic percent) to about 20 at %. The nanocrystalline graphene may have a density of about 1.6 g/cc to about 2.1 g/cc.

In some example embodiments, the nanocrystalline graphene may be directly grown on a substrate at a temperature of about 700° C. or less through a plasma enhanced chemical vapor deposition process.

According to some example embodiments, a graphene product includes a nanocrystalline graphene. The nanocrystalline graphene may include nano-sized crystals and may have hydrogen in an amount of about 1 at % (atomic percent) to about 20 at %.

In some example embodiments, a size of the nano-sized crystals may range about 0.5 nm to about 100 nm. The nanocrystalline graphene may have a ratio of carbon having an $sp^2$ bonding structure to total carbon within a range of about 50% to about 99%. The nanocrystalline graphene may have a density of about 1.6 g/cc to about 2.1 g/cc.

In some example embodiments, the nanocrystalline graphene may be directly grown on a substrate at a temperature of about 700° C. or less through a plasma enhanced chemical vapor deposition process.

According to some example embodiments, a graphene product may include a nanocrystalline graphene. The nanocrystalline graphene may include nano-sized crystals having a size of about 0.5 nm to about 100 nm and may have a D-parameter of an Auger spectrum of carbon in a range of about 18 eV to 22.9 eV.

In some example embodiments, the nanocrystalline graphene may have a ratio of carbon having an $sp^2$ bonding structure to total carbon within a range of about 50% to about 99%.

In some example embodiments, the nanocrystalline graphene may include hydrogen in an amount of about 1 at % to about 20 at %.

In some example embodiments, the nanocrystalline graphene may have a density of about 1.6 g/cc to about 2.1 g/cc.

In some example embodiments, a sheet resistance of the nanocrystalline graphene may be greater than 1000 Ohm/sq.

In some example embodiments, the graphene product may further include a substrate. The nanocrystalline graphene may be directly on a surface of the substrate.

In some example embodiments, the substrate may include at least one of a group IV semiconductor material, a semiconductor compound having at least two elements, a metal, or an insulative material.

In some example embodiments, the substrate may include at least one of aluminum (Al), gold, (Au) antimony (Sb), arsenic (As), boron (B), cadmium (Cd), carbon (C), chromium (Cr), cobalt (Co), copper (Cu), gadolinium (Gd), gallium (Ga), germanium (Ge), hafnium (Hf), indium (In), manganese (Mn), molybdenum (Mo), nickel (Ni), nitrogen (N), phosphorus (P), ruthenium (Ru), selenium (Se), silicon (Si), sulfur (S), tellurium (Te), tungsten (W), titanium (Ti), tantalum (Ta), gold (Au), yttrium (Y), zinc (Zn), or zirconium (Zr).

In some example embodiments, the nanocrystalline graphene may be directly grown on a substrate at a temperature of about 700° C. or less through a plasma enhanced chemical vapor deposition process.

According to an aspect of another embodiment, there is provided a method of forming a graphene product including a nanocrystalline graphene through a plasma enhanced chemical vapor deposition process is provided. The nanocrystalline graphene may include nano-sized crystals and may have a ratio of carbon having an $sp^2$ bonding structure to total carbon within a range of about 50% to 99%. The method may include growing the nanocrystalline graphene directly on a substrate using a plasma of a reaction gas at a temperature of about 700° C. or less. The reaction gas may include a carbon source and an inert gas.

In some example embodiments, a size of the nano-sized crystals in the nanocrystalline graphene may range from about 0.5 nm to about 100 nm. The nanocrystalline graphene may include hydrogen in an amount of about 1 at % (atomic percent) to about 20 at %. The nanocrystalline graphene may have a density of about 1.6 g/cc to about 2.1 g/cc.

In some example embodiments, reaction gas may not include hydrogen gas.

In some example embodiments, the reaction gas may further include hydrogen gas. A volume ratio of the carbon source, the inert gas, and the hydrogen gas may be about 1:0.01 to 5000:0 to 300.

In some example embodiments, the carbon source may include at least one of hydrocarbon gas or a vapor of a liquid precursor containing carbon.

In some example embodiments, the liquid precursor may include at least one of an aromatic hydrocarbon having a chemical formula of $C_xH_y$ (where $6 \leq x \leq 42$ and $6 \leq y \leq 28$), a derivative of the aromatic hydrocarbon, an aliphatic hydrocarbon having a chemical formula of $C_xH_y$ (where $1 \leq x \leq 12$ and $2 \leq y \leq 26$), or a derivative of the aliphatic hydrocarbon.

In some example embodiments, the inert gas may include at least one of argon gas, neon gas, nitrogen gas, helium gas, krypton gas, or xenon gas.

In some example embodiments, the growing the nanocrystalline graphene may be performed at a process temperature of about 180° C. to about 700° C. The growing the nanocrystalline graphene may be performed at a process pressure of about 0.001 Torr to about 10 Torr.

In some example embodiments, the growing the nanocrystalline graphene may include generating the plasma of the reaction gas by at least one of a radio frequency (RF) plasma generating device or a microwave (MW) plasma generating device. The plasma of the growing the nanocrystalline graphene may be a RF plasma having a frequency range of about 3 MHz to about 100 MHz, or may be a MW plasma having a frequency range of about 0.7 GHz to about 2.5 GHz.

In some example embodiments, a power for the generating the plasma of the reaction gas may range from about 10 W to about 4000 W.

In some example embodiments, the substrate may include at least one of a group IV semiconductor material, a semiconductor compound, a metal, or an insulative material.

In some example embodiments, the group IV semiconductor material may include at least one silicon (Si), germanium (Ge), or tin (Sn). The semiconductor compound may include a material having at least two of silicon (Si), germanium (Ge), carbon (C), zinc (Zn), cadmium (Cd), aluminum (Al), gallium (Ga), indium (In), boron (B), nitrogen (N), phosphorus (P), sulfur (S), selenium (Se), arsenic (As), antimony (Sb), or tellurium (Te) combined with each other. The metal may include at least one of copper (Cu), molybdenum (Mo), nickel (Ni), aluminum (Al), tungsten (W), ruthenium (Ru), cobalt (Co), manganese (Mn), titanium (Ti), tantalum (Ta), gold (Au), hafnium (Hf), zirconium (Zr), zinc (Zn), yttrium (Y), chromium (Cr), or gadolinium (Gd).

In some example embodiments, the insulative material may include at least one of one of silicon (Si), nickel (Ni), aluminum (Al), tungsten (W), ruthenium (Ru), cobalt (Co), manganese (Mn), titanium (Ti), tantalum (Ta), gold (Au), hafnium (Hf), zirconium (Zr), zinc (Zn), yttrium (Y), chromium (Cr), copper (Cu), molybdenum (Mo), and or gadolinium (Gd), or an oxide thereof, or a nitride thereof, or a carbide thereof, or a derivative thereof. At least one of the oxide, the nitride, the carbide, or the derivative may include hydrogen (H).

In some example embodiments, the substrate may further include a dopant.

In some example embodiments, the method may further include pretreating a surface of the substrate using a reducing gas before the growing of the nanocrystalline graphene.

In some example embodiments, the reducing gas may include at least one of hydrogen, nitrogen, chlorine, fluorine, ammonia, or a derivative thereof. The reducing gas may further include an inert gas.

In some example embodiments, the method may further include forming a second nanocrystalline graphene after the growing the nanocrystalline graphene directly on the substrate. The growing the nanocrystalline graphene directly on the substrate may form a first nanocrystalline graphene directly on the substrate using a first mixing ratio of the reaction gas to form the plasma. The forming the second nanocrystalline graphene may form the second nanocrystalline graphene on the first nanocrystalline graphene using a second mixing ratio of the reaction gas to form the plasma. The second mixing ratio may be different than the first mixing ratio.

In some example embodiments, the reaction gas may not include hydrogen gas.

In some example embodiments, the reaction gas may further include hydrogen gas.

According to an aspect of another embodiment, there is provided a device including a plasma enhanced chemical vapor deposition machine configured to perform the method of forming nanocrystalline graphene.

According to an aspect of another embodiment, a method of forming a graphene product including a nanocrystalline graphene through a plasma enhanced chemical vapor deposition process is provided. The nanocrystalline graphene may include nano-sized crystals and may have a ratio of carbon having an $sp^2$ bonding structure to total carbon within a range of about 50% to 99%. The method may include injecting a reaction gas including a carbon source and an inert gas into a reaction chamber, generating a plasma of the reaction gas in the reaction chamber, and growing the nanocrystalline graphene directly on a surface of a substrate using the plasma of the reaction gas at a temperature of about 700° C. or less.

In some example embodiments, a size of the nano-sized crystals may range from about 0.5 nm to about 100 nm. The nanocrystalline graphene may include hydrogen in an amount of about 1 at % (atomic percent) to about 20 at %. The nanocrystalline graphene may have a density of about 1.6 g/cc to about 2.1 g/cc.

In some example embodiments, the method may further include pretreating the surface of the substrate using a reducing gas.

In some example embodiments, the method may further include forming a second nanocrystalline graphene after the growing the nanocrystalline graphene directly on the surface of the substrate. The growing the nanocrystalline graphene directly on the surface of the substrate may form a first nanocrystalline graphene directly on the surface of the substrate using a first mixing ratio of the reaction gas to form the plasma. The forming the second nanocrystalline graphene may form the second nanocrystalline graphene on the first nanocrystalline graphene using a second mixing ratio of the reaction gas to form the plasma. The second mixing ratio may be different than the first mixing ratio.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
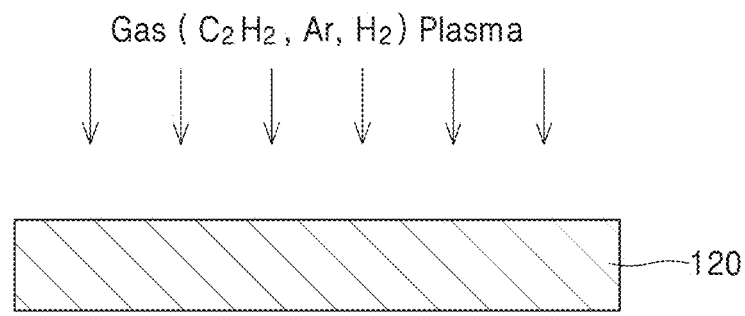
FIGS. 1A to 1C are views illustrating a method of forming nanocrystalline graphene, according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, example embodiments will be described with reference to the accompanying drawings. In the drawings, like reference numerals refer to like elements, and the sizes of elements may be exaggerated for clarity of illustration. The embodiments described below are for illustrative purposes only, and various modifications may be made therefrom.

In the following description, when an element is referred to as being "above" or "on" another element, it may be directly on the other element while making contact with the other element or may be above the other element without making contact with the other element. The terms of a singular form may include plural forms unless specifically mentioned. It will be further understood that the terms "comprises" and/or "comprising" used herein specify the presence of stated features or elements, but do not preclude the presence or addition of one or more other features or elements. An element referred to with the definite article or a demonstrative pronoun may be construed as the element or the elements even though it has a singular form.

In the following embodiments, nanocrystalline graphene and methods of growing nanocrystalline graphene on a surface of a substrate through a plasma enhanced chemical vapor deposition (PECVD) process will be described.

In the following embodiments, nanocrystalline graphene refers to graphene having nano-sized crystals. For example, nanocrystalline graphene may include crystals having a size of about 100 nm or less.

For example, general crystalline graphene, nanocrystalline graphene according to embodiments, and an amorphous carbon layer will now be compared with each other.

The ratio of carbon having an $sp^2$ bonding structure to total carbon may be obtained by measuring a D-parameter through X-ray photoelectron spectroscopy (XPS) analysis (described later). For example, in XPS analysis, the peak shape of an Auger spectrum of carbon varies with the ratio of carbon having an $sp^2$ bonding structure to total carbon. In a D-parameter spectrum obtained by differentiating the peak shape, the gap between the highest point and the lowest point is a D-parameter. Therefore, general crystalline graphene, the nanocrystalline graphene, and an amorphous carbon layer may be distinguished by measuring the D-parameter of an Auger spectrum of carbon. In addition, the content of hydrogen (described later) may be obtained, for example, through composition analysis by Rutherford backscattering spectroscopy (RBS).

For example, general crystalline graphene, also called "intrinsic graphene," may include crystals having a size of greater than about 100 nm. In the case of general crystalline graphene, the D-parameter of an Auger spectrum of carbon may be about 23 eV. In this case, the ratio of carbon having an $sp^2$ bonding structure to total carbon may be near 100%. Such general crystalline graphene includes substantially no hydrogen. In addition, for example, general crystalline graphene may have a density of about 2.1 g/cc and a sheet resistance of about 100 Ohm/sq to about 300 Ohm/sq.

The nanocrystalline graphene may include crystals smaller than crystals of general crystalline graphene. For example, the nanocrystalline graphene may include crystals having a size of about 0.5 nm to about 100 nm. In the case of the nanocrystalline graphene, the D-parameter of an Auger spectrum of carbon may be about 18 eV to 22.9 eV. In this case, the ratio of carbon having an $sp^2$ bonding structure to total carbon may be, for example, about 50% to about 99%. For example, the nanocrystalline graphene may include hydrogen in an amount of about 1 at % (atomic percent) to about 20 at %. In addition, for example, the nanocrystalline graphene may have a density of about 1.6 g/cc to about 2.1 g/cc and a sheet resistance of greater than about 1000 Ohm/sq.

In the case of an amorphous carbon layer, the D-parameter of an Auger spectrum of carbon may have a value ranging between the D-parameter of diamond (that is, about 13 eV) and the D-parameter of the nanocrystalline graphene. In this case, the ratio of carbon having an $sp^2$ bonding structure to total carbon may be, for example, about 30% to about 50%. In addition, for example, an amorphous carbon layer may include hydrogen in an amount of greater than about 20 at %.

Figure 1B:
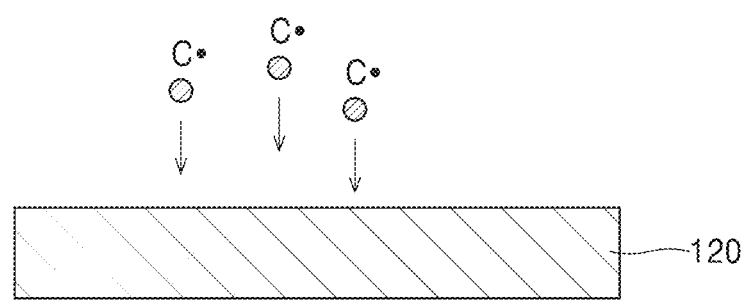
Figure 1C:

FIGS. 1A to 1C are views illustrating a method of forming nanocrystalline graphene according to an example embodiment.

Referring to FIG. 1A, a reaction gas for growing nanocrystalline graphene 190 (refer to FIG. 1C) is injected into a reaction chamber (not shown) in which a substrate 120 is provided, and then power for generating plasma is applied to the reaction chamber.

For example, the substrate 120 for growing the nanocrystalline graphene 190 thereon is first prepared inside the reaction chamber. In the present embodiment, the substrate 120 for growing the nanocrystalline graphene 190 may include various materials.

For example, the substrate 120 may include at least one of a group IV semiconductor material, a semiconductor compound, a metal, and an insulative material. For example, the IV group semiconductor material may include silicon (Si), germanium (Ge), or tin (Sn). In addition, for example, the semiconductor compound may include a material in which at least two of silicon (Si), germanium (Ge), carbon (C), zinc (Zn), cadmium (Cd), aluminum (Al), gallium (Ga), indium (In), boron (B), nitrogen (N), phosphorus (P), sulfur (S), selenium (Se), arsenic (As), antimony (Sb), and tellurium (Te) are combined with each other.

For example, the metal may include at least one of copper (Cu), molybdenum (Mo), nickel (Ni), aluminum (Al), tungsten (W), ruthenium (Ru), cobalt (Co), manganese (Mn), titanium (Ti), tantalum (Ta), gold (Au), hafnium (Hf), zirconium (Zr), zinc (Zn), yttrium (Y), chromium (Cr), and gadolinium (Gd). The insulative material may include at least one of silicon (Si), aluminum (Al), hafnium (Hf), zirconium (Zr), zinc (Zn), titanium (Ti), tantalum (Ta), tungsten (W), and manganese (Mn), or the insulative material may include at least one of an oxide, a nitride, a carbide, and a derivative thereof of at least one of silicon (Si), nickel (Ni), aluminum (Al), tungsten (W), ruthenium (Ru), cobalt (Co), manganese (Mn), titanium (Ti), tantalum (Ta), gold (Au), hafnium (Hf), zirconium (Zr), zinc (Zn), yttrium (Y), chromium (Cr), copper (Cu), molybdenum (Mo), and gadolinium (Gd). At least one of the oxide, the nitride, the carbide, and the derivative may further include hydrogen (H). In addition, the substrate 120 may further include a dopant. The above-mentioned materials of the substrate 120 are merely examples, and the substrate 120 may include various other materials.

Next, the reaction gas for growing the nanocrystalline graphene 190 is injected into the reaction chamber. The reaction gas may include a carbon source, an inert gas, and hydrogen gas. Alternatively, the reaction gas may not include hydrogen gas. FIG. 1A illustrates an example in which the reaction gas include a carbon source, an inert gas, and hydrogen gas. The carbon source may be a source supplying carbon for nanocrystalline graphene growth. For example, the carbon source may include at least one of hydrocarbon gas and vapor of a liquid precursor containing carbon.

For example, the hydrocarbon gas may include methane gas, ethylene gas, acetylene gas, or propylene gas. However, these gases are examples, and the hydrocarbon gas may include various other gases.

In addition, the liquid precursor may include at least one of an aromatic hydrocarbon having a chemical formula of $C_xH_y$ ($6 \leq x \leq 42$, $6 \leq y \leq 28$), a derivative of the aromatic hydrocarbon, an aliphatic hydrocarbon having a chemical formula of $C_xH_y$ ($1 \leq x \leq 12$, $2 \leq y \leq 26$), and a derivative of the aliphatic hydrocarbon. Here, the aromatic hydrocarbon may, for example, include benzene, toluene, xylene, anisole, or the like, and the aliphatic hydrocarbon may, for example, include hexane, octane, isopropyl alcohol, ethanol, or the like. However, these materials are merely examples.

For example, the inert gas may include at least one of argon gas, neon gas, nitrogen gas, helium gas, krypton gas, and xenon gas. FIG. 1A illustrates an example of using acetylene gas as the carbon source and argon gas as the inert gas.

Next, a plasma power supply (not shown) applies power for generating plasma inside the reaction chamber. Here, the power for generating plasma may range from about 10 W to about 4000 W. However, the power is not limited thereto.

For example, the plasma power supply may be a radio frequency (RF) plasma generating device or a microwave (MW) plasma generating device. In this case, so as to grow the nanocrystalline graphene 190, the RF plasma generating device may generate RF plasma, for example, within a frequency range of about 3 MHz to about 100 MHz, or the MW plasma generating device may generate MW plasma, for example, within a frequency range of about 0.7 GHz to about 2.5 GHz. However, these frequency ranges are merely examples. That is, other frequency ranges may be used. In addition, the plasma power supply may include a plurality of RF plasma generating devices or a plurality of MW plasma generating devices.

When power for generating plasma inside the reaction chamber is applied from the plasma power supply to the reaction chamber, an electric field may be induced inside the reaction chamber. As the electric field is induced in a state in which the reaction gas is injected, plasma for growing the nanocrystalline graphene 190 is formed.

When it is intended to grow the nanocrystalline graphene 190 using plasma, the mixing ratio of the reaction gas injected into the reaction chamber, that is, the volume ratio of the carbon source, the inert gas, and hydrogen gas may be, for example, about 1:0.01 to 5000:0 to 300. Here, the volume ratio of the carbon source, the inert gas, and hydrogen gas included in the reaction gas may be adjusted according to growth conditions.

A process temperature for growing the nanocrystalline graphene 190 may be about 700° C. or less which is lower than the process temperature of a general chemical vapor deposition (CVD) process. For example, the process temperature inside the reaction chamber may range from about 180° C. to about 700° C. The process temperature may from about 180° C. to about 700° C. may correspond to a temperature of the substrate on which the nanocrystalline graphene 190 is formed. In addition, a process pressure for growing the nanocrystalline graphene 190 may range from about 0.001 Torr to about 10 Torr. However, this process pressure range is merely an example. That is, the process pressure may be set to be within another range.

Referring to FIG. 1B, carbon radicals C. activated by the plasma of the reaction gas in which the carbon source, the inert gas, and hydrogen gas are mixed are adsorbed on a surface of the substrate 120. For example, in the reaction gas, plasma of the inert gas generates active carbon radicals C. from the carbon source, and the active carbon radicals C. are adsorbed on the surface of the substrate 120, thereby activating the surface of the substrate 120. In addition, the plasma of the inert gas continuously induces activation of the substrate 120, and thus the adsorption of active carbon radicals C. on the surface of the substrate 120 may be accelerated.

Referring to FIG. 1C, as the adsorption of active carbon radicals C. on the surface of the substrate 120 is accelerated as described above, the nanocrystalline graphene 190 may be grown on the surface of the substrate 120 within a short period of time.

In this manner, the nanocrystalline graphene 190 may be grown on the surface of the substrate 120 at a relatively high rate. For example, the nanocrystalline graphene 190 may be grown on the surface of the substrate 120 at a thickness growth rate of about 0.05 nm or greater per minute. However, the growth rate of the nanocrystalline graphene 190 is not limited thereto. Therefore, the nanocrystalline graphene 190 may be grown to an intended thickness within a relatively short period of time. For example, the nanocrystalline graphene 190 may be grown on the surface of the substrate 120 within a time period of about 60 minutes or less. In another example, the nanocrystalline graphene 190 may be grown on the surface of the substrate 120 within a time period of about 30 minutes or less, or within a time period of about 10 minutes or less. However, the growth rate of the nanocrystalline graphene 190 is not limited thereto. As described above, owing to the plasma of the inert gas, the nanocrystalline graphene 190 may be formed directly on the surface of the substrate 120 to an intended thickness within a relatively short period of time. The nanocrystalline graphene 190 may have a single-layer or multi-layer structure.

In the present embodiment, the reaction gas including the carbon source, the inert gas, and hydrogen gas is used in a PECVD process, and the surface of the substrate 120 is activated by plasma of the inert gas. Therefore, it is possible to directly grow the nanocrystalline graphene 190 on the surface of the substrate 120 within a relatively short period of time even at a relatively low temperature, 700° C. or less.

Table 1 below shows results of an XPS experiment in which a surface of a substrate was measured while varying the mixing ratio of a carbon source and an inert gas included in a reaction gas during the above-described PECVD process. In the experiment, acetylene gas and m-xylene were used as the carbon source, and argon gas was used as the inert gas.

In Table 1, "$sp^2$ bonding carbon ratio" refers to the ratio of carbon having an $sp^2$ bonding structure to total carbon measured by XPS analysis, and this is the same in other tables.

TABLE 1

| Carbon Source (sccm) | Ar (sccm) | $H_2$ (sccm) | C:Ar ratio | XPS $sp^2$ bonding carbon ratio (%) |
|---|---|---|---|---|
| 20 (acetylene) | 10 | 50 | 1:0.5 | 83.5 |
| 5 (acetylene) | 5 | 95 | 1:1 | 90.7 |
| 0.1 (m-xylene) | 105 | 5 | 1:1050 | 83.6 |
| 0.02 (m-xylene) | 95 | 5 | 1:4750 | 86.6 |

Referring to Table 1, when the volume ratio of the carbon source and argon gas was 1:0.5, 1:1, 1:1050, and 1:4750, the ratio of carbon having an $sp^2$ bonding structure to total carbon was 83.5%, 90.7%, 83.6%, and 86.6%, respectively. In all the cases in which the volume ratio of the carbon source and argon gas was 1:0.5, 1:1, 1:1050, and 1:4750, nanocrystalline graphene was formed on the surface of the substrate.

Table 2 below shows results of an XPS experiment in which a surface of a substrate was measured while varying the mixing ratio of a carbon source and hydrogen gas included in a reaction gas during the above-described PECVD process. In the experiment, acetylene gas and m-xylene were used as the carbon source, and argon gas was used as the inert gas.

TABLE 2

| Carbon Source (sccm) | Ar (sccm) | $H_2$ (sccm) | C:$H_2$ ratio | XPS $sp^2$ bonding carbon ratio (%) |
|---|---|---|---|---|
| 20 (acetylene) | 95 | 1 | 1:0.05 | 92.8 |
| 20 (acetylene) | 50 | 50 | 1:2.5 | 86.7 |
| 0.15 (m-xylene) | 115 | 20 | 1:133 | 76.5 |
| 0.15 (m-xylene) | 115 | 30 | 1:200 | 95.8 |

Referring to Table 2, when the volume ratio of the carbon source and hydrogen gas was 1:0.05, 1:2.5, 1:133, and 1:200, the ratio of carbon having an $sp^2$ bonding structure to total carbon was 92.8%, 86.7%, 76.5%, and 95.8%, respectively. In all the cases in which the volume ratio of the carbon source and hydrogen gas was 1:0.05, 1:2.5, 1:133, and 1:200, nanocrystalline graphene was formed on the surface of the substrate.

Table 3 below shows results of an XPS experiment that were obtain while varying the process pressure of the above-described PECVD process.

TABLE 3

| Processing pressure (Torr) | XPS $sp^2$ bonding carbon ratio (%) |
|---|---|
| 0.005 | 82.3 |
| 0.02 | 86.7 |
| 3 | 70.4 |

Referring to Table 3, when the process pressure was 0.005 Torr, 0.02 Torr, and 3 Torr, the ratio of carbon having an $sp^2$ bonding structure to total carbon was 82.3%, 86.7%, and 70.4%, respectively. In all the cases in which the process pressure was 0.005 Torr, 0.02 Torr, and 3 Torr, nanocrystalline graphene was formed on a surface of a substrate.

Table 4 below shows results of an XPS experiment that were obtain while varying power for generating plasma in the above-described PECVD process.

TABLE 4

| Power (W) | XPS $sp^2$ bonding carbon ratio (%) |
|---|---|
| 20 | 75.6 |
| 25 | 80.6 |
| 2000 | 79.5 |
| 3000 | 79.5 |

Referring to Table 4, when the power for generating plasma was 20 W, 25 W, 2000 W, and 3000 W, the ratio of carbon having an $sp^2$ bonding structure to total carbon was 75.6%, 80.6%, 79.5%, and 79.5%, referring to. In all the cases in which the power for generating plasma was 20 W, 25 W, 2000 W, and 3000 W, nanocrystalline graphene was formed on a surface of a substrate.

Figure 2A:
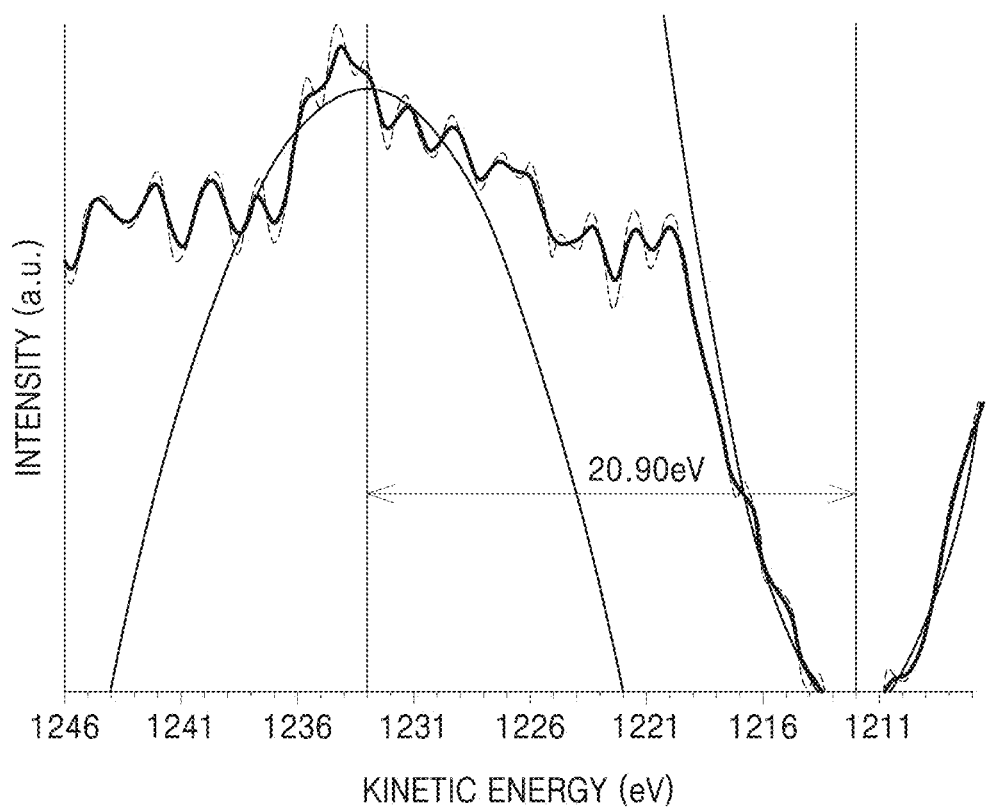
FIGS. 2A and 2B are graphs respectively illustrating D-parameter spectrums of nanocrystalline graphene and an amorphous carbon layer.
Figure 2B:
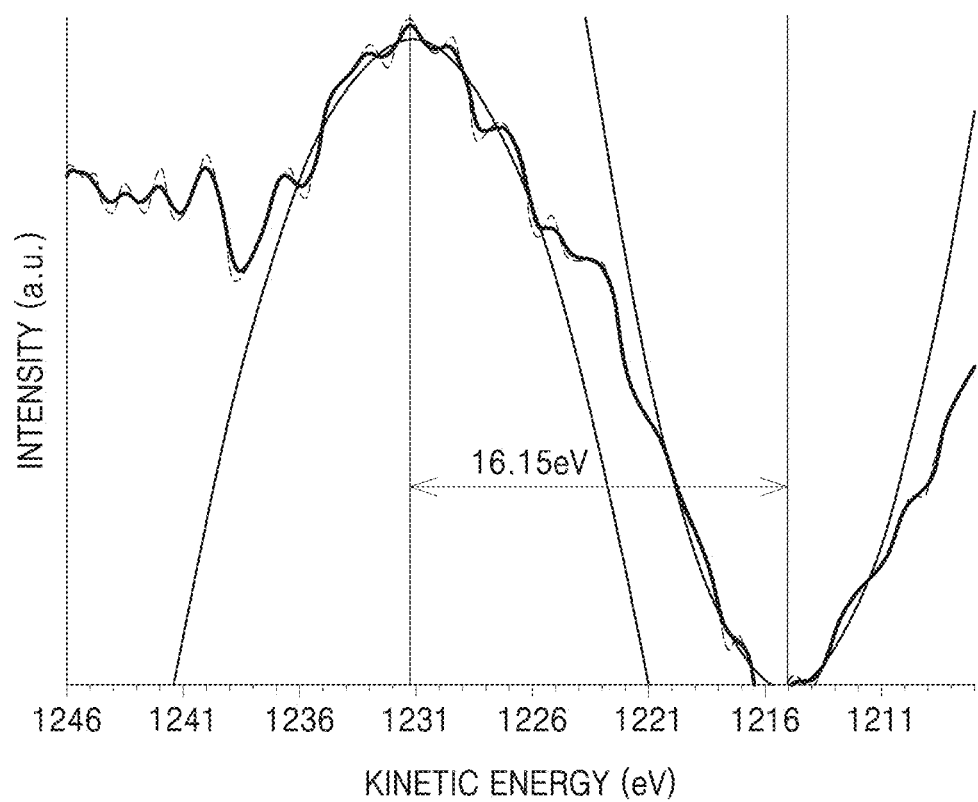

FIGS. 2A and 2B are graphs respectively illustrating D-parameter spectrums of nanocrystalline graphene and an amorphous carbon layer.

In the case of FIG. 2A, a polysilicon substrate was used as a substrate in a PECVD process, and an RF plasma generating device (13.56 MHz) was used as a plasma power supply. In addition, power for generating RF plasma was 600 W. Growing conditions were as follows: a growing temperature of 700° C., a process pressure of 0.02 Torr, and a growing time period of 20 minutes. In addition, a carbon source, an inert gas, and hydrogen gas included in a reaction gas were 1 sccm of acetylene gas, 50 sccm of argon gas, and 100 sccm of hydrogen gas.

A D-parameter spectrum of a material layer formed on a surface of the polysilicon substrate through the PECVD process is shown in FIG. 2A. Referring to FIG. 2A, a D-parameter of about 20.90 eV was measured in the D-parameter spectrum, and this shows that nanocrystalline graphene was grown on the surface of the polysilicon substrate. In this case, the thickness of the nanocrystalline graphene was measured to be about 2 nm. When an inert gas was included in a reaction gas as described above, nanocrystalline graphene was grown directly on the surface of the substrate within a relative short period of time.

In addition, FIG. 2B illustrates an example D-parameter spectrum of an amorphous carbon layer in which a D-parameter is about 16.15 eV, differing from the D-parameter of the nanocrystalline graphene described above.

Figure 3A:
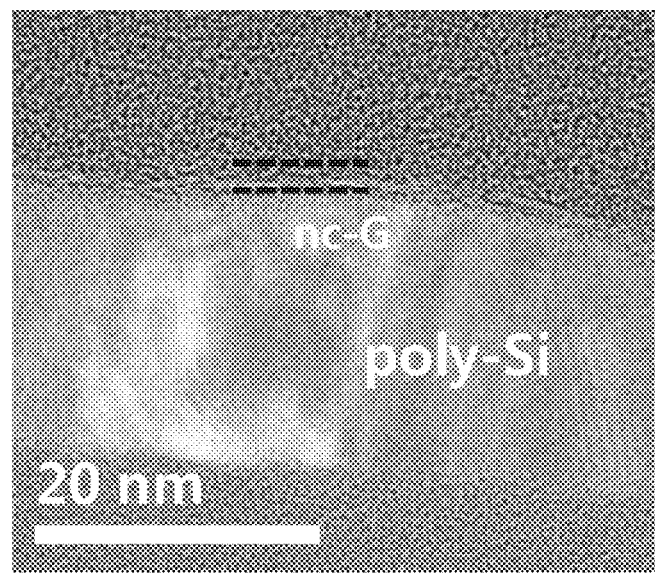
FIG. 3A is a transmission electron microscope (TEM) image illustrating nanocrystalline graphene grown on a polysilicon substrate using radio frequency (RF) plasma, according to an example embodiment.
Figure 3B:
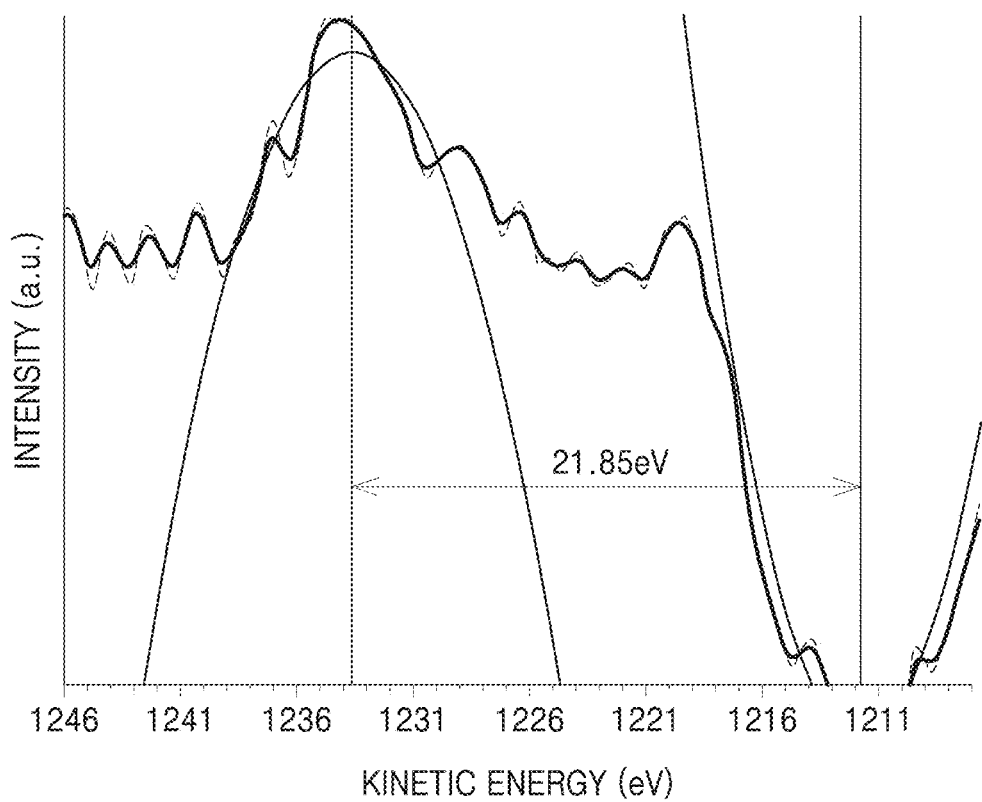
FIG. 3B is a graph illustrating a D-parameter spectrum of the nanocrystalline graphene shown in FIG. 3A.

FIG. 3A is a transmission electron microscope (TEM) image showing nanocrystalline graphene grown on a polysilicon substrate using RF plasma according to an example embodiment. In FIG. 3A, poly-Si refers to the polysilicon substrate, and nc-G refers to the nanocrystalline graphene formed on a surface of the polysilicon substrate. FIG. 3B is a graph illustrating a D-parameter spectrum of the nanocrystalline graphene shown in FIG. 3A. In the D-parameter spectrum shown in FIG. 3B, a D-parameter was measured to be about 21.85 eV.

In FIGS. 3A and 3B, an RF plasma generating device (13.56 MHz) was used as a plasma power supply, and power for generating RF plasma was 300 W. Growing conditions were as follows: a growing temperature of 700° C., a process pressure of 0.03 Torr, and a growing time period of 10 minutes. In addition, acetylene gas, an inert gas, and hydrogen gas included in a reaction gas were 1 sccm of acetylene gas, 50 sccm of argon gas, and 100 sccm of hydrogen gas.

Referring to FIGS. 3A and 3B, nanocrystalline graphene was grown on the surface of the polysilicon substrate to a thickness of about 1 nm in a relatively short period time: 10 minutes.

Figure 4A:
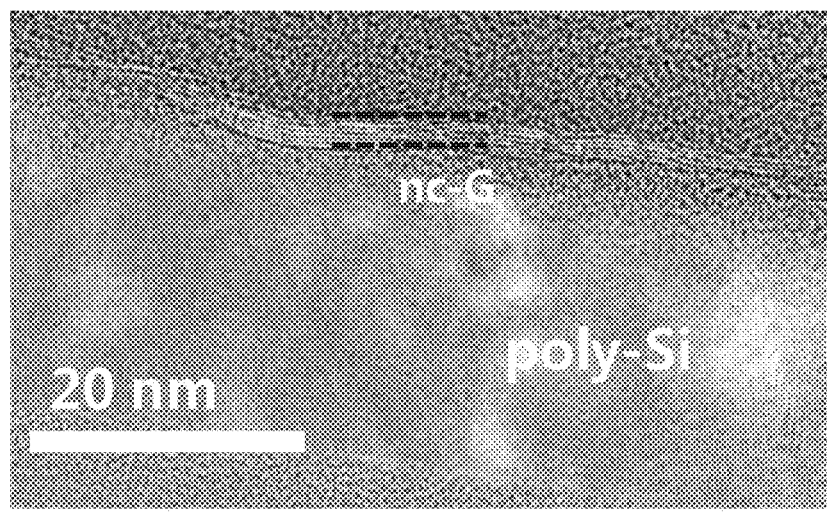
FIG. 4A is a TEM image illustrating nanocrystalline graphene formed on a polysilicon substrate using microwave (MW) plasma, according to an example embodiment.
Figure 4B:
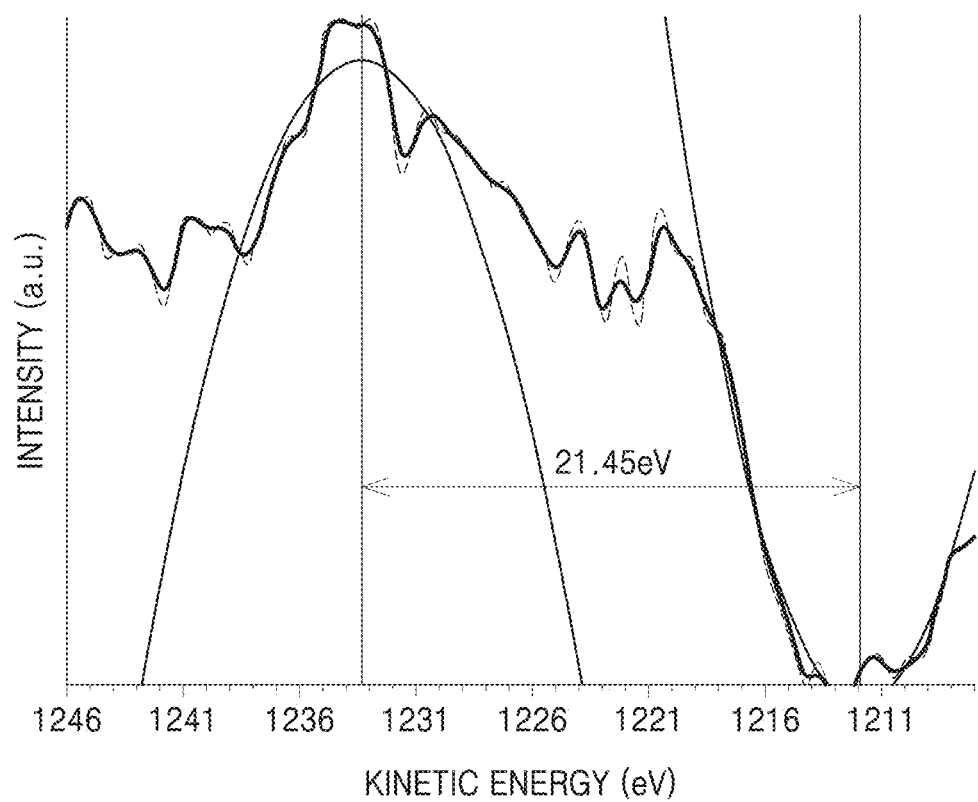
FIG. 4B is a graph illustrating a D-parameter spectrum of the nanocrystalline graphene shown in FIG. 4A.

FIG. 4A is a TEM image showing nanocrystalline graphene grown on a polysilicon substrate using MW plasma according to an example embodiment. In FIG. 4A, poly-Si refers to the polysilicon substrate, and nc-G refers to the nanocrystalline graphene formed on a surface of the polysilicon substrate. FIG. 4B is a graph illustrating a D-parameter spectrum of the nanocrystalline graphene shown in FIG. 4A. In the D-parameter spectrum shown in FIG. 4B, a D-parameter was measured to be about 21.45 eV.

In FIGS. 4A and 4B, an MW plasma generating device (0.9 GHz) was used as a plasma power supply, and power for generating MW plasma was 425 W. Growing conditions were as follows: a growing temperature of 700° C., a process pressure of 0.4 Torr, and a growing time period of 3 minutes. In addition, acetylene gas, an inert gas, and hydrogen gas included in a reaction gas were 1 sccm of acetylene gas, 50 sccm of argon gas, and 0.5 sccm of hydrogen gas.

Figure 4C:
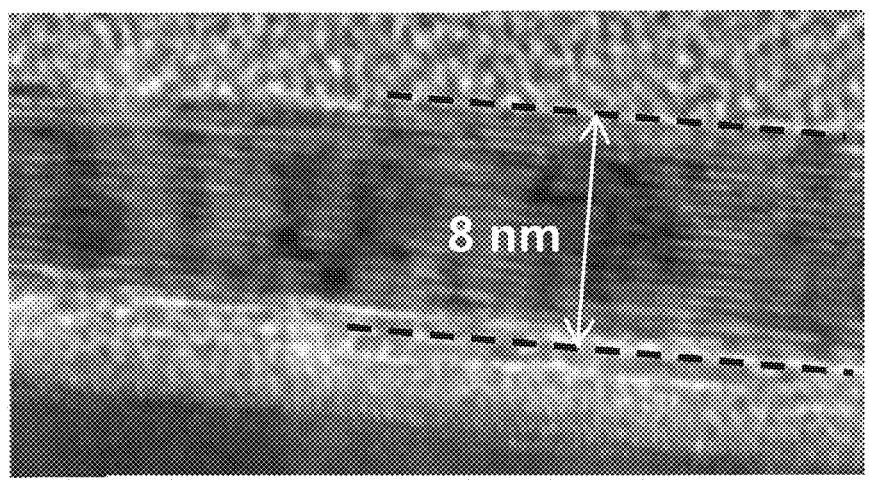
FIG. 4C is a TEM image illustrating nanocrystalline graphene grown to a thickness of about 8 nm by adjusting growing conditions of FIG. 4A.

Referring to FIGS. 4A and 4B, nanocrystalline graphene was grown on the surface of the polysilicon substrate to a thickness of about 2 nm in a relatively short period time: 3 minutes. In addition, referring to FIG. 4C, nanocrystalline graphene may be grown to a relatively large thickness, 8 nm, by adjusting growing conditions such as a growing time period.

Figure 5A:
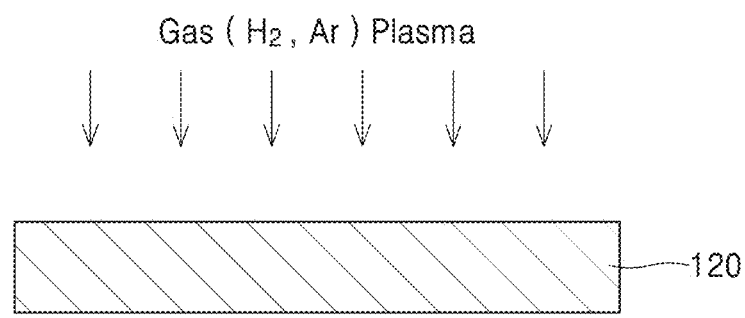
FIGS. 5A to 5C are views illustrating a method of forming nanocrystalline graphene, according to another example embodiment.
Figure 5B:
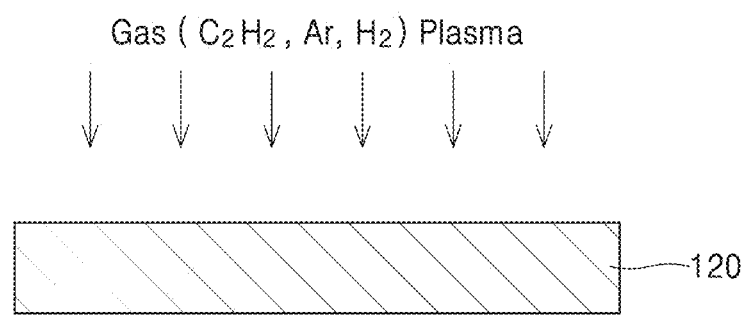
Figure 5C:
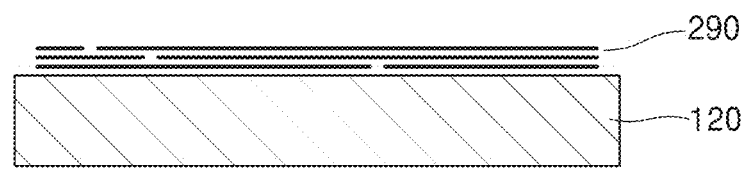

FIGS. 5A to 5C are views illustrating a method of forming nanocrystalline graphene according to another example embodiment.

Referring to FIG. 5A, a pretreatment process is performed on a surface of a substrate 120 using a reducing gas before growing nanocrystalline graphene 290 (refer to FIG. 5C). Here, the pretreatment process for the substrate 120 may be performed to remove substances such as impurities or oxygen remaining on the surface of the substrate 120.

For example, the substrate 120 for growing the nanocrystalline graphene 290 thereon is first prepared inside a reaction chamber. Here, the substrate 120 may include various materials as described above. For example, the substrate 120 may include at least one of a group IV semiconductor material, a semiconductor compound, a metal, and an insulative material. For example, the IV group semiconductor material may include silicon (Si), germanium (Ge), or tin (Sn). In addition, for example, the semiconductor compound may include a material in which at least two of silicon (Si), germanium (Ge), carbon (C), zinc (Zn), cadmium (Cd), aluminum (Al), gallium (Ga), indium (In), boron (B), nitrogen (N), phosphorus (P), sulfur (S), selenium (Se), arsenic (As), antimony (Sb), and tellurium (Te) are combined with each other.

For example, the metal may include at least one of copper (Cu), molybdenum (Mo), nickel (Ni), aluminum (Al), tungsten (W), ruthenium (Ru), cobalt (Co), manganese (Mn), titanium (Ti), tantalum (Ta), gold (Au), hafnium (Hf), zirconium (Zr), zinc (Zn), yttrium (Y), chromium (Cr), and gadolinium (Gd). The insulative material may include at least one of silicon (Si), aluminum (Al), hafnium (Hf), zirconium (Zr), zinc (Zn), titanium (Ti), tantalum (Ta), tungsten (W), and manganese (Mn), or the insulative material may include at least one of an oxide, a nitride, a carbide, and a derivative thereof of at least one of silicon (Si), nickel (Ni), aluminum (Al), tungsten (W), ruthenium (Ru), cobalt (Co), manganese (Mn), titanium (Ti), tantalum (Ta), gold (Au), hafnium (Hf), zirconium (Zr), zinc (Zn), yttrium (Y), chromium (Cr), copper (Cu), molybdenum (Mo), and gadolinium (Gd). At least one of the oxide, the nitride, the carbide, and the derivative may further include hydrogen (H). In addition, the substrate 120 may further include a dopant.

Next, gas for the pretreatment of the substrate 120 is injected into the reaction chamber. At this time, the pretreatment gas may be a reducing gas. Here, for example, the reducing gas may include at least one of hydrogen, nitride, chlorine, fluorine, ammonia, and a derivative thereof. However, the reducing gas is not limited thereto. In addition to the reducing gas, an inert gas may be additionally injected into the reaction chamber. Here, for example, the inert gas may include at least one of argon gas, neon gas, helium gas, krypton gas, and xenon gas. FIG. 5A illustrates an example of using hydrogen gas as the reducing gas and argon gas as the inert gas.

Next, a plasma power supply applies power to form plasma inside the reaction chamber. Here, the power for generating plasma may range from about 10 W to about 4000 W. For example, at least one RF plasma generating device or at least one MW plasma generating device may be used as the plasma power supply.

When power for generating plasma inside the reaction chamber is applied from the plasma power supply to the reaction chamber, an electric field may be induced inside the reaction chamber. In a state in which the reducing gas (or a mixture of the reducing gas and the inert gas) is injected into the reaction chamber as described above, plasma for the pretreatment of the substrate 120 is formed as an electric field is induced. The surface of the substrate 120 may be processed by the plasma formed as described above. In addition, the pretreatment process may be performed on the substrate 120 in a state in which a voltage is applied to the substrate 120. However, the pretreatment process is not limited thereto. That is, voltage may not be applied to the substrate 120. Owing to this, substances such as impurities or oxygen remaining on the surface of the substrate 120 may be removed. After the substrate pretreatment process, substances such as gases or impurities remaining in the reaction chamber may be discharged to the outside of the reaction chamber.

Referring to FIG. 5B, after the pretreatment process of the substrate 120, a reaction gas for growing the nanocrystalline graphene 290 is injected into the reaction chamber, and then power is applied to form plasma inside the reaction chamber.

For example, the reaction gas for growing the nanocrystalline graphene 290 is first injected into the reaction chamber. The reaction gas may include a carbon source, an inert gas, and hydrogen gas. Alternatively, the reaction gas may not include hydrogen gas. FIG. 5B illustrates an example in which the reaction gas include a carbon source, an inert gas, and hydrogen gas.

For example, the carbon source may include at least one of hydrocarbon gas and vapor of a liquid precursor containing carbon. For example, the hydrocarbon gas may include methane gas, ethylene gas, acetylene gas, or propylene gas. However, these gases are examples.

For example, the liquid precursor may include at least one of an aromatic hydrocarbon having a chemical formula of $C_xH_y$ (6≤x≤42, 6≤y≤28), a derivative of the aromatic hydrogen, an aliphatic hydrocarbon having a chemical formula of $C_xH_y$ (1≤x≤12, 2≤y≤26), and a derivative of the aliphatic hydrogen. Here, the aromatic hydrocarbon may, for example, include benzene, toluene, xylene, anisole, or the like, and the aliphatic hydrocarbon may, for example, include hexane, octane, isopropyl alcohol, ethanol, or the like. However, these materials are merely examples.

For example, the inert gas may include at least one of argon gas, neon gas, nitrogen gas, helium gas, krypton gas, and xenon gas. FIG. 5B illustrates an example of using acetylene gas as the carbon source and argon gas as the inert gas.

Next, the plasma power supply applies power to form plasma inside the reaction chamber. Here, the power for generating plasma may range from about 10 W to about 4000 W. For example, at least one RF plasma generating device or at least one MW plasma generating device may be used as the plasma power supply. In this case, the RF plasma generating device may generate RF plasma, for example, within a frequency range of about 3 MHz to about 100 MHz, or the MW plasma generating device may generate MW plasma, for example, within a frequency range of about 0.7 GHz to about 2.5 GHz. However, the power is not limited thereto. When power for generating plasma inside the reaction chamber is applied from the plasma power supply to the reaction chamber, an electric field may be induced inside the reaction chamber. As the electric field is induced in a state in which the reaction gas is injected, plasma for growing the nanocrystalline graphene 290 is formed.

When it is intended to grow the nanocrystalline graphene 290 using plasma, the mixing ratio of the reaction gas injected into the reaction chamber, that is, the volume ratio of the carbon source, the inert gas, and hydrogen gas may be, for example, about 1:0.01 to 5000:0 to 300. Here, the volume ratio of the carbon source, the inert gas, and hydrogen gas included in the reaction gas may be adjusted according to growth conditions.

A process temperature may be set to be within the range of about 180° C. to about 700° C., and a process pressure may be set to be within the range of about 0.001 Torr to about 10 Torr. However, these are examples. That is, the process temperature or the process pressure may be set to be within another range.

As the electric field is induced in a state in which the reaction gas is injected as described above, plasma for growing the nanocrystalline graphene 290 is formed. In the reaction gas, plasma of the inert gas generates active carbon radicals from the carbon source, and the active carbon radicals are adsorbed on the surface of the substrate 120, thereby activating the surface of the substrate 120. In addition, the plasma of the inert gas continuously induces activation of the substrate 120, and thus the adsorption of the active carbon radicals on the surface of the substrate 120 may be accelerated.

Referring to FIG. 5C, as the adsorption of active carbon radicals on the surface of the substrate 120 is accelerated as described above, the nanocrystalline graphene 290 may be grown on the surface of the substrate 120 within a short period of time.

In this manner, the nanocrystalline graphene 290 may be grown on the surface of the substrate 120 at a relatively high rate. For example, the nanocrystalline graphene 290 may be grown on the surface of the substrate 120 at a thickness growth rate of about 0.05 nm or greater per minute. However, the thickness growth rate of the nanocrystalline graphene 290 is not limited thereto. Therefore, the nanocrystalline graphene 290 may be grown to an intended thickness within a relatively short period of time: about 60 minutes or less (for example, about 30 minutes or less, or about 10 minutes or less). As described above, the nanocrystalline graphene 290 may be formed on the surface of the substrate 120 to an intended thickness within a relatively short period of time. The nanocrystalline graphene 290 may have a single-layer or multi-layer structure.

According to the present embodiment, after the surface of the substrate 120 is pretreated using the reducing gas (or a mixture of the reducing gas and the inert gas), the nanocrystalline graphene 290 is grown on the pretreated surface of the substrate 120, and thus the nanocrystalline graphene 290 may have relatively high quality.

FIGS. 6A to 6D are views illustrating a method of forming nanocrystalline graphene according to another example embodiment.

Figure 6A:
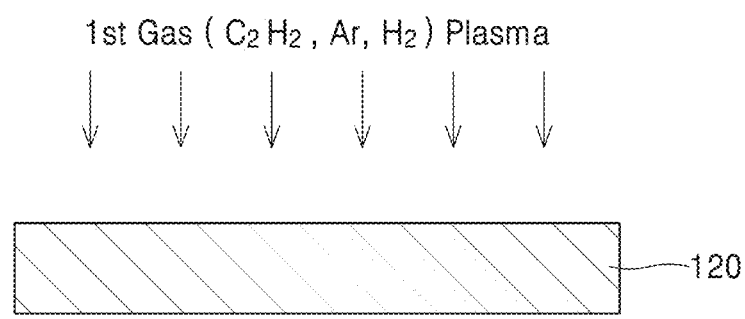
FIGS. 6A to 6D are views illustrating a method of forming nanocrystalline graphene, according to another example embodiment.

Referring to FIG. 6A, a first reaction gas is injected into a reaction chamber in which a substrate 120 is provided, and then power for generating plasma is applied to the reaction chamber. In addition, although not shown in FIG. 6A, a pretreatment process may be performed on the substrate 120 as described with reference to FIG. 5A before the injection of the first reaction gas.

For example, first, the substrate 120 is prepared in the reaction chamber. As described above, the substrate 120 may include at least one of a group IV semiconductor material, a semiconductor compound, a metal, and an insulative material. The substrate 120 may further include a dopant. However, these materials are merely examples.

Next, the first reaction gas is injected into the reaction chamber. Here, the first reaction gas may be a reaction gas for growing first nanocrystalline graphene 391 (described later with reference to FIG. 6D). For example, the first reaction gas may include a carbon source, an inert gas, and hydrogen gas. Alternatively, the first reaction gas may not include hydrogen gas. FIG. 6A illustrates an example in which the first reaction gas includes a carbon source, an inert gas, and hydrogen gas.

For example, the carbon source may include at least one of hydrocarbon gas and vapor of a liquid precursor containing carbon. For example, the hydrocarbon gas may include methane gas, ethylene gas, acetylene gas, or propylene gas. In addition, the liquid precursor may include at least one of an aromatic hydrocarbon having a chemical formula of $C_xH_y$, ($6 \leq x \leq 42$, $6 \leq y \leq 28$), a derivative of the aromatic hydrocarbon, an aliphatic hydrocarbon having a chemical formula of $C_xH_y$ ($1 \leq x \leq 12$, $2 \leq y \leq 26$), and a derivative of the aliphatic hydrocarbon.

For example, the inert gas may include at least one of argon gas, neon gas, nitrogen gas, helium gas, krypton gas, and xenon gas. FIG. 6A illustrates an example of using acetylene gas as the carbon source and argon gas as the inert gas.

Next, a plasma power supply applies power to form plasma inside the reaction chamber. Here, the power for generating plasma may range from about 10 W to about 4000 W. For example, at least one RF plasma generating device or at least one MW plasma generating device may be used as the plasma power supply. In this case, the RF plasma generating device may generate RF plasma, for example, within a frequency range of about 3 MHz to about 100 MHz, or the MW plasma generating device may generate MW plasma, for example, within a frequency range of about 0.7 GHz to about 2.5 GHz. However, the power is not limited thereto.

When power for generating plasma inside the reaction chamber is applied from the plasma power supply to the reaction chamber, an electric field may be induced inside the reaction chamber. As the electric field is induced in a state in which the first reaction gas is injected, plasma for growing the first nanocrystalline graphene 391 is formed.

When it is intended to grow the first nanocrystalline graphene 391 using plasma, the mixing ratio of the first reaction gas, that is, the volume ratio of the carbon source, the inert gas, and hydrogen gas may be, for example, about 1:0.01 to 5000:0 to 300.

For example, the volume ratio of the carbon source, the inert gas, and hydrogen gas of the first reaction gas may be adjusted to further activate a surface of the substrate 120 and thus to increase nucleation density. A process temperature may be set to be within the range of about 180° C. to about 700° C., and a process pressure may be set to be within the range of about 0.01 Torr to about 10 Torr. However, these are non-limiting examples.

As the electric field is induced in a state in which the first reaction gas is injected as described above, plasma for growing the first nanocrystalline graphene 391 is formed. Then, in the first reaction gas, plasma of the inert gas generates active carbon radicals from the carbon source, and the active carbon radicals are adsorbed on the surface of the substrate 120, thereby activating the surface of the substrate 120. The plasma of the inert gas continuously induces activation of the substrate 120, and thus the adsorption of the active carbon radicals may be accelerated.

Figure 6B:

Referring to FIG. 6B, as the adsorption of active carbon radicals on the surface of the substrate 120 continues, the first nanocrystalline graphene 391 may be grown on the surface of the substrate 120. The first nanocrystalline graphene 391 may be grown on the surface of the substrate 120 at a relatively high rate within a relatively short period of time. The first nanocrystalline graphene 391 may have a single-layer or multi-layer structure. After the formation of the first nanocrystalline graphene 391 is finished, gas remaining in the reaction chamber may be discharged to the outside.

Figure 6C:
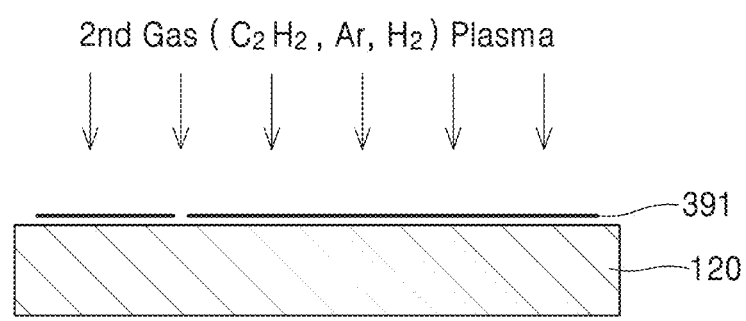

Referring to FIG. 6C, after the first nanocrystalline graphene 391 is formed on the surface of the substrate 120 as described above, a second reaction gas for forming second nanocrystalline graphene 392 (refer to FIG. 6D) is injected into the reaction chamber, and then power for generating plasma is applied to the reaction chamber.

For example, first, the second reaction gas is injected into the reaction chamber. Here, the second reaction gas may be a reaction gas for growing the second nanocrystalline graphene 392 (described later). Like the first reaction gas, the second reaction gas may include a carbon source, an inert gas, and hydrogen gas. Alternatively, the second reaction gas may not include hydrogen gas.

As described above, for example, the carbon source may include at least one of hydrocarbon gas and vapor of a liquid precursor containing carbon. In addition, for example, the inert gas may include at least one of argon gas, neon gas, nitrogen gas, helium gas, krypton gas, and xenon gas. FIG. 6C illustrates an example of using acetylene gas as the carbon source and argon gas as the inert gas.

Next, the plasma power supply applies power to form plasma inside the reaction chamber. Here, the power for generating plasma may range from about 10 W to about 4000 W. As described above, at least one RF plasma generating device or at least one MW plasma generating device may be used as the plasma power supply. When power for generating plasma inside the reaction chamber is applied from the plasma power supply to the reaction chamber, an electric field may be induced inside the reaction chamber. As the electric field is induced in a state in which the second reaction gas is injected, plasma for growing the second nanocrystalline graphene 392 is formed.

When it is intended to grow the second nanocrystalline graphene 392 using plasma, the mixing ratio of the second reaction gas, that is, the volume ratio of the carbon source, the inert gas, and hydrogen gas may be, for example, about 1:0.01 to 5000:0 to 300.

The mixing ratio of the carbon source, the inert gas, and hydrogen gas included in the second reaction gas may be different from the mixing ratio of the gases included in the first reaction gas. For example, the mixing ratio of the carbon source, the inert gas, and hydrogen gas included in the second reaction gas may be adjusted to grow the second nanocrystalline graphene 392 more uniformly than the first nanocrystalline graphene 391.

A process temperature may be set to be within the range of about 180° C. to about 700° C., and a process pressure may be set to be within the range of about 0.001 Torr to about 10 Torr. However, these are non-limiting examples.

As the electric field is induced in a state in which the second reaction gas is injected as described above, plasma for growing the second nanocrystalline graphene 392 is formed. Then, in the second reaction gas, plasma of the inert gas generates active carbon radicals from the carbon source, and the active carbon radicals may be continuously adsorbed on a surface of the first nanocrystalline graphene 391 formed on the substrate 120.

Figure 6D:
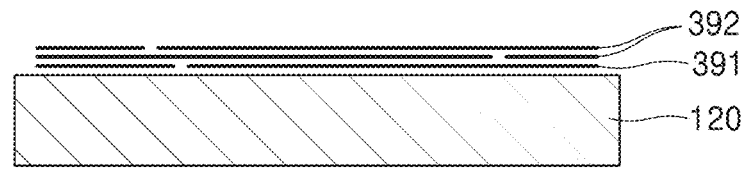

Referring to FIG. 6D, as active carbon radicals are continuously adsorbed on the surface of the first nanocrystalline graphene 391, the second nanocrystalline graphene 392 may be grown on the surface of the first nanocrystalline graphene 391. Here, the second nanocrystalline graphene 392 may be grown more uniformly than the first nanocrystalline graphene 391 by adjusting the mixing ratio of the carbon source, the inert gas, and hydrogen gas. The second nanocrystalline graphene 392 may be grown on the surface of the first nanocrystalline graphene 391 at a relatively high rate within a relatively short period of time. The second nanocrystalline graphene 392 may have a single-layer or multi-layer structure.

According to the present embodiment, the nanocrystalline graphene growing process is performed in two steps by adjusting the mixing ratio of the carbon source, the inert gas, and hydrogen gas, and thus the first nanocrystalline graphene 391 and the second nanocrystalline graphene 392 may be sequentially formed on the surface of the substrate 120. The case of growing two different nanocrystalline graphene layers on the substrate 120 by performing a growth process twice while varying the mixing ratio of a carbon source, an inert gas, and hydrogen gas has been described as an example. However, the present embodiment is not limited thereto. For example, the growth process may be performed three or more times in the above-described manner to grow three or more different nanocrystalline graphene layers on the substrate 120.

According to an example embodiment, nanocrystalline graphene including nano-sized crystals and having a ratio of carbon having an $sp^2$ bonding structure to total carbon within the range of about 50% to 99% may be formed through a PECVD process. In the PECVD process, a reaction gas may include a carbon source, an inert gas, and hydrogen gas, and a surface of a substrate may be activated by plasma of the inert gas, thereby making possible to grow nanocrystalline graphene directly on the surface of the substrate at a relatively low temperature, 700° C. or less. In addition, a substrate pretreatment process may be performed to obtain nanocrystalline graphene having improved quality, and a nanocrystalline graphene growing process may be performed a plurality of times while varying the mixing ratio of the reaction gas to form a plurality of different nanocrystalline graphene layers on the substrate.

The technique of growing nanocrystalline graphene directly on a substrate at a relatively low temperature may be applied to a complementary metal-oxide-semiconductor (CMOS) process for forming elements of a semiconductor device such as a barrier metal or a source/drain contact, a pellicle of exposure equipment, etc.

Figure 7A:
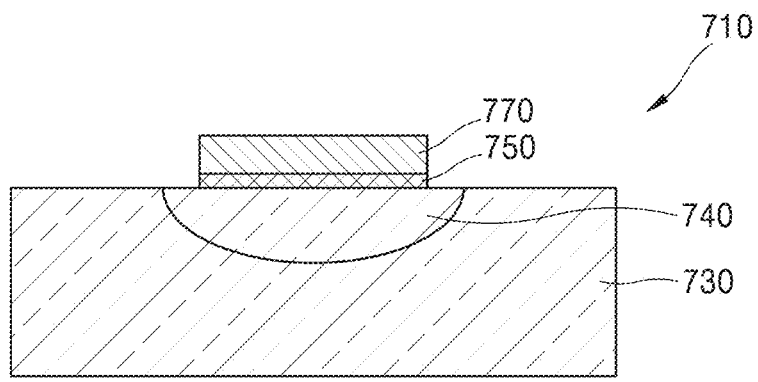
FIGS. 7A to 7C are cross-sectional views of electronic devices according to other example embodiments.
Figure 7B:
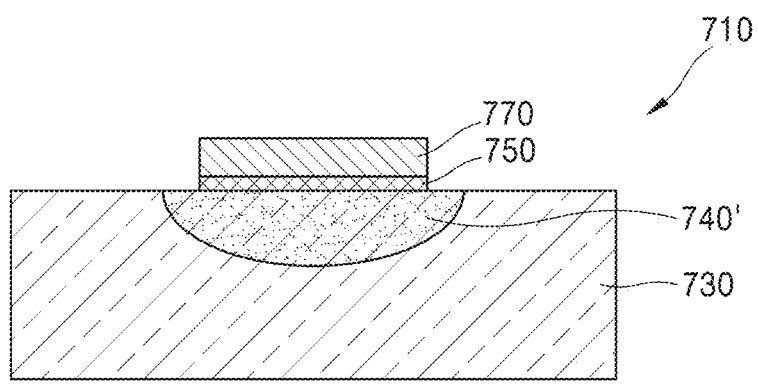
Figure 7C:
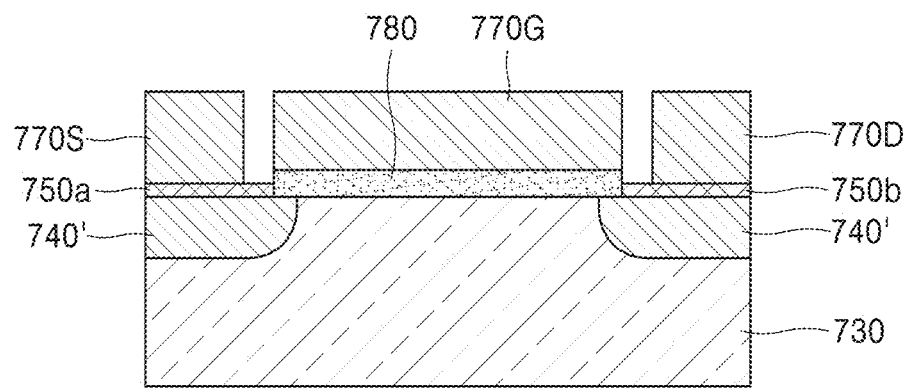

FIGS. 7A to 7C are cross-sectional views of electronic devices according to other example embodiments.

Referring to FIG. 7A, an electronic device 710 may include a substrate 730 (e.g., semiconductor layer), a graphene layer 750 formed on an undoped area 740 of the substrate 730, and a conductive layer 770 (e.g., metal layer) formed on the graphene layer 750.

Referring to FIG. 7B, an electronic device 710 may be the same as the electronic device 710 in FIG. 7A, except the electronic device 710 in FIG. 7B may include a doped area 740' instead of the undoped area 740 in FIG. 7A. The graphene layer 750 may be formed on the doped area 740'.

The graphene layers 750 in FIGS. 7A and 7B may be formed using one of the embodiments in FIG. 1A to 1C, 5A to 5C, or 6A to 6C of the present application. The graphene layer 750 and conductive layer 770 may be sequentially formed on the substrate 730 and patterned to define a stack over the undoped area 740 or doped area 740'.

The electronic device 710 may be an interconnect in a CMOS device such as DRAM, PRAM, logic devices, and the like.

Referring to FIG. 7C, a transistor 770 includes a substrate 730, impurity regions 740' for the source and drain, a gate insulating layer 780 between a first graphene 750a and a second graphene 750b, and conductive layers (770S, 770G, 770D) providing the electrodes.

The graphene layers 750a and 750b in FIG. 7C may be formed using any one of the embodiments in FIG. 1A to 1C, 5A to 5C, or 6A to 6C of the present application. A conductive film may be formed on over the graphene layer and gate insulating film 780 and patterned to form conductive layers (770S, 770G, 770D) providing the electrodes. The conductive layers (770S, 770G, 770D) may be formed of a conductive material, such as a metal or metal alloy.

Figure 8A:
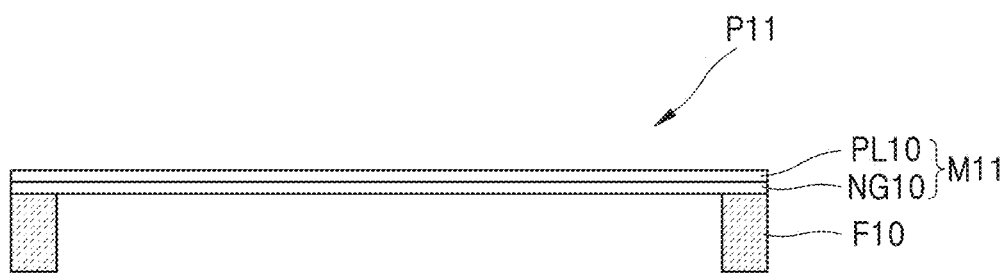
FIGS. 8A to 8C are cross-sectional views of pellicles according to some example embodiments.
Figure 8B:
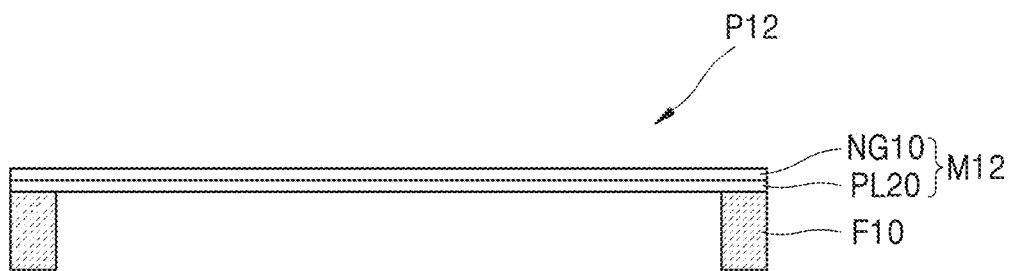
Figure 8C:
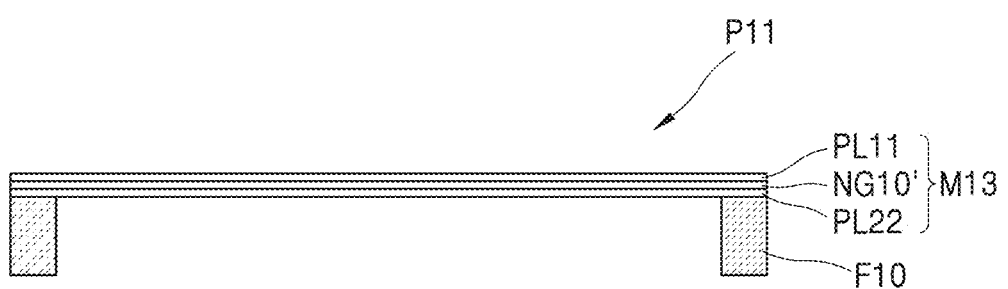

FIGS. 8A to 8C are cross-sectional views of pellicles according to some example embodiments.

Referring to FIG. 8A, a pellicle P11 may include a frame F10 and a pellicle membrane M11. The pellicle membrane M11 may include a protective layer PL10 on a first material layer NG10. The first material layer NG10 may include a nanocrystalline graphene formed according to one of the embodiments in FIG. 1A to 1C, 5A to 5C, or 6A to 6C of the present application.

Referring to FIG. 8B, a pellicle P12 may be the same as the pellicle PL11 in FIG. 8A, except the pellicle P12 includes pellicle membrane M12 that includes the first material layer NG10 on the protective layer PL20. The pellicle membrane M12 may be on a frame F10.

Referring to FIG. 8C, a pellicle P13 may include a pellicle membrane M13 that includes the first material layer NG10' between two protective layers PL11 and PL22. The pellicle membrane M13 may be on a frame F10. The first material layer NG10' may include a nanocrystalline graphene formed according to any one of the embodiments in FIG. 1A to 1C, 5A to 5C, or 6A to 6C of the present application.

In FIGS. 8A to 8C, the protective layers PL10, PL11, PL20, and PL22 may each independently include at least one a carbon-based material, a metal chalcogenide-based material, a silicon derivative, or a metal oxide.

FIGS. 9A to 9H are cross-sectional views of device structures including a barrier layer according to some example embodiments.

Figure 9A:
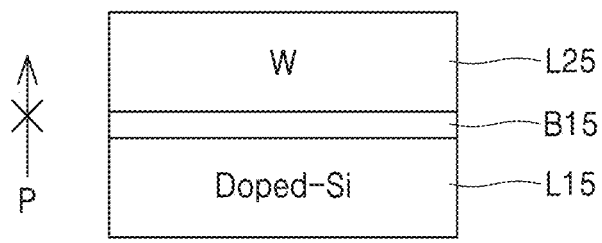
FIGS. 9A to 9H are cross-sectional views of device structures including a barrier layer according to some example embodiments.

In FIG. 9A, a device structure may include a barrier layer B15 between a semiconductor layer L15 (e.g., doped Si) and a metal layer L25 (e.g., W).

Figure 9B:
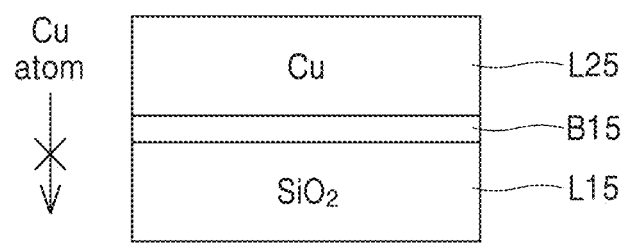

In FIG. 9B, a device structure may include a barrier layer B16 between a metal layer L26 (e.g., Cu) and an insulating layer L16 (e.g., $SiO_2$).

Figure 9C:
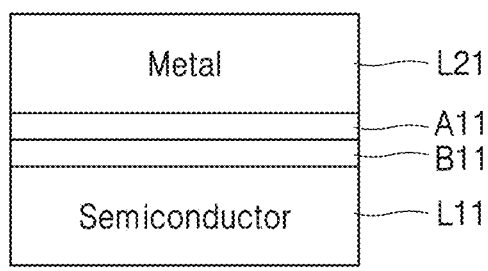

In FIG. 9C, a device structure may include a semiconductor layer L11, a barrier layer B11, an adhesion layer A11, and a metal layer L21 sequentially stacked.

Figure 9D:
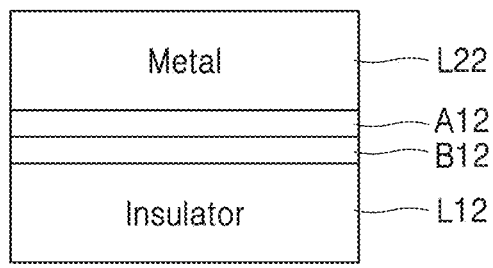

In FIG. 9D, a device structure may include an insulating layer L12, a barrier layer B12, an adhesion layer A12, and a metal layer L22 sequentially stacked.

A silicide layer may be substituted for the metal layers L21 and L22 in FIGS. 9C and 9D.

Figure 9E:
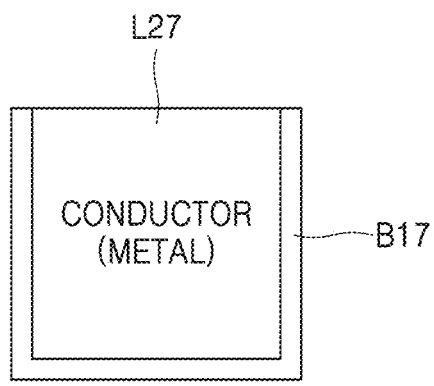

In FIG. 9E, a barrier layer B17 may partially surround a conductor L27. The conductor L27 may be a metal layer. The barrier layer B17 may surround a lower surface and a side surface of the conductor L27.

Figure 9F:
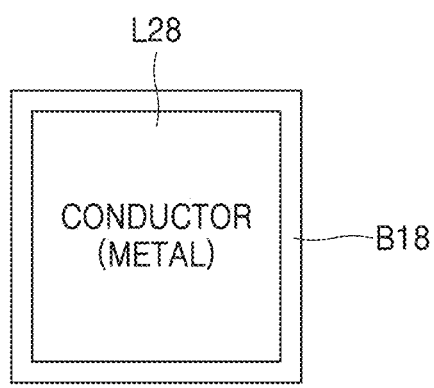

In FIG. 9F, a barrier layer B18 may completely surround a conductor L28. The conductor L28 may be a metal layer.

Figure 9G:
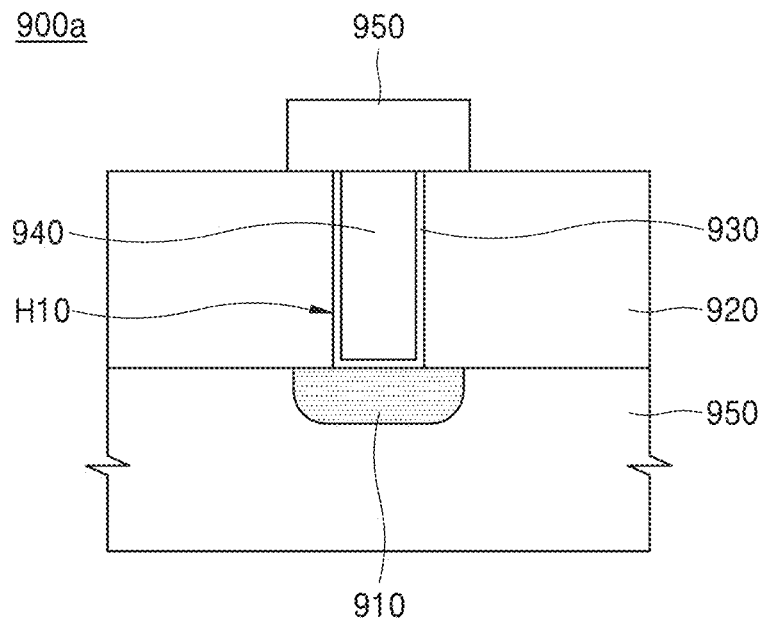

In FIG. 9G, an electronic device 900a may include a device portion 905 having a semiconductor region 910, an insulating layer 920 defining a hole H10 that exposes the semiconductor region 910, a contact structure 940 (e.g., metal) on the semiconductor region, a barrier layer 930 surrounding the bottom surface and sidewalls of the contact structure 940, and an electrode 950 on top of the contact structure 940. The device portion 905 may be part of a circuit (e.g., logic circuit, memory circuit, image sensor circuit).

Figure 9H:
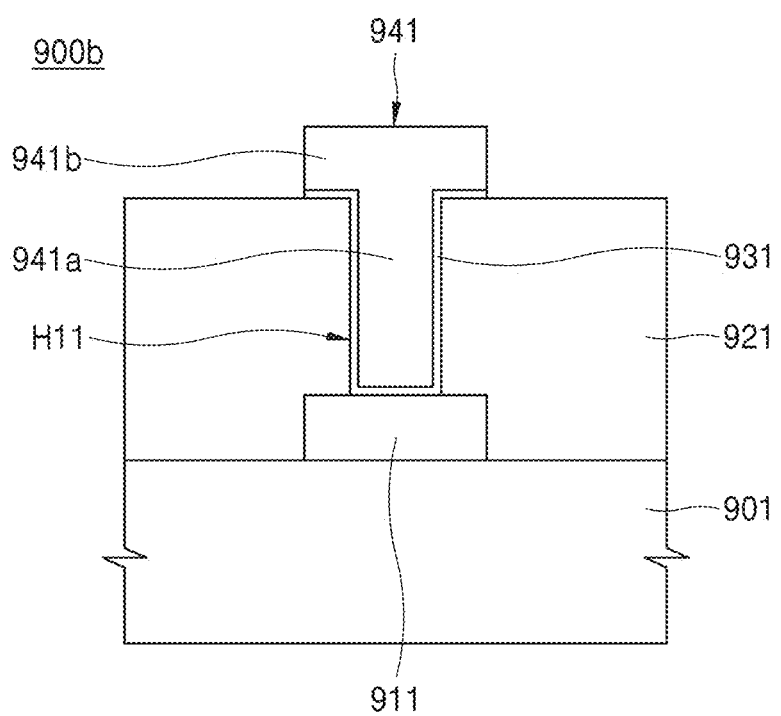

In FIG. 9H, an electronic device 900b may include an understructure 901, an element layer 911 on the understructure 901, an insulating layer 921 covering the understructure 901 and element layer 911, and a barrier layer 931 and a contact structure 941 extending into a hole H11 defined by the insulating layer 921 that exposes the element layer 911. The barrier layer 931 may surround bottom and side surface of the contact structure 941. The element layer 111 may be an electrode connected to a device portion (not illustrated) or may be a part of the device portion.

In FIGS. 9A to 9H, the barrier layers B11, B12, B15, B16, B17, B18, 930, and 931 may include a nanocrystalline graphene formed according to any one of the embodiments in FIG. 1A to 1C, 5A to 5C, or 6A to 6C of the present application.

Figure 10:
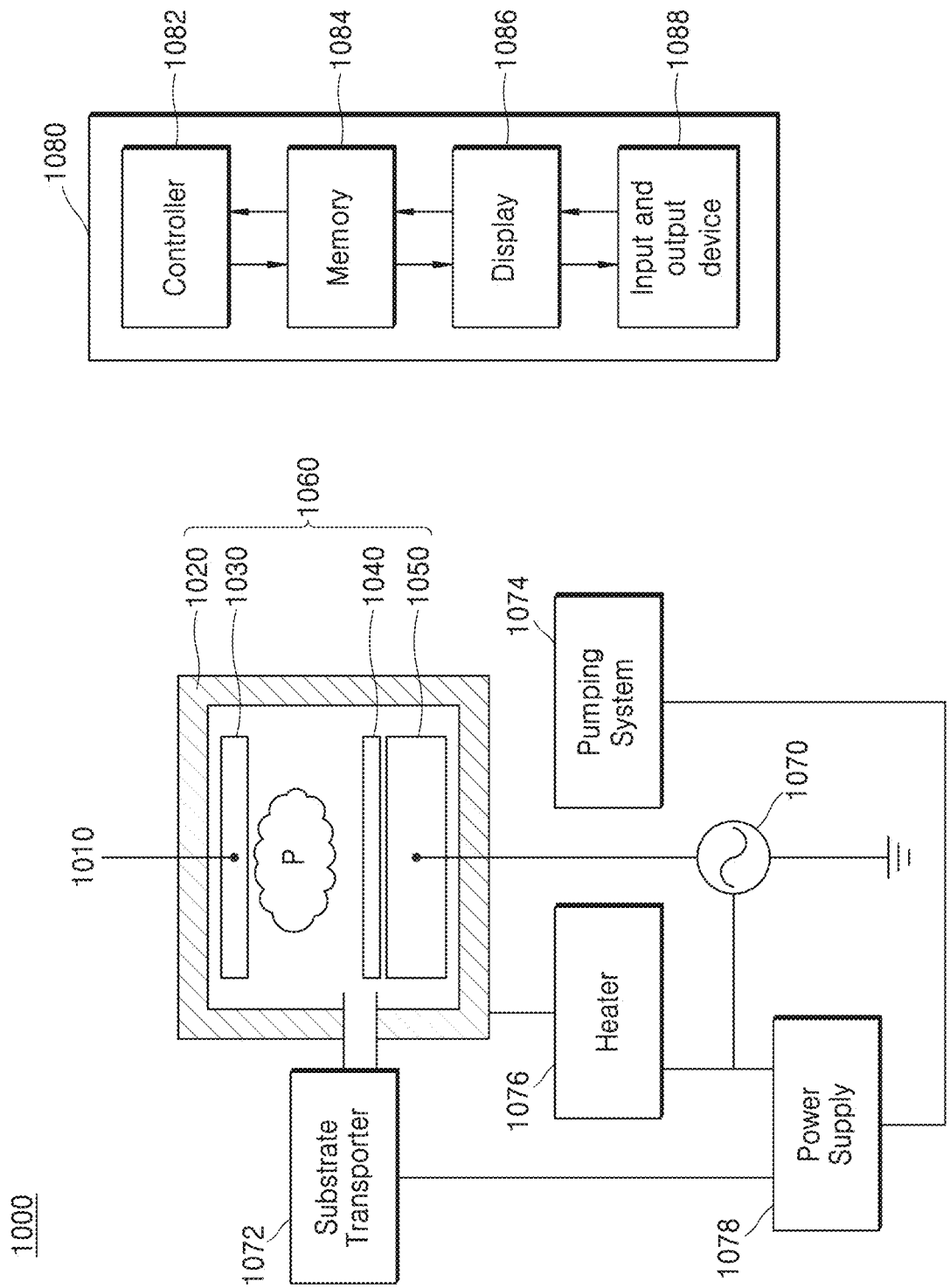
FIG. 10 is a cross-sectional view of a device for forming nanocrystalline graphene according to some example embodiments.

FIG. 10 is a cross-sectional view of a device for forming nanocrystalline graphene according to some example embodiments.

Referring to FIG. 10, a device 1000 may be configured to form a graphene product according to any one of the embodiments in FIG. 1A to 1C, 5A to 5C, or 6A to 6C of the present application.

The device 1000 may include an upper electrode 1010, a process chamber 1060, a plasma generation unit 1070, a substrate transporter 1072, a pumping system 1074, a heater 1076, a power supply 1078, and an operation station 1080.

The process chamber 1060 may include a chamber housing 1020, an upper electrode 1030 in the chamber housing 1020, and a substrate support 1050 in the chamber housing 1020. The upper electrode 1030 may be connected to a gas supply 1010 with conduits and gas flow controllers for providing reaction gases into the process chamber 1060. The substrate support 1050 may be an electrostatic chuck, but is not limited thereto.

A substrate transporter 1072, such as a robot arm, may transport a substrate 1040 into and out of the process chamber 1060. The process chamber 1060 may include a gate valve that opens when the substrate transporter 1072 transports the substrate 1040 into or out of the process chamber 1060 and closes when the process chamber 1060 performs operations (e.g., vacuum processes). A heater 1074 may control the temperature of the substrate support 1050, inner wall of process chamber 1060, and upper electrode 1030. An RF power generator 1070, may be connected to the substrate support 1050 and may be used to generate a plasma P of a reaction gas in the process chamber 1060. Alternatively, a microwave power supply may be used to generate the plasma P in the process chamber 1060. A pumping system 1074 connected to the process chamber 1060 may create a vacuum in the process chamber 1060. A power supply 1078 may provide electrical power to the device 1000.

The operation station 1080 may control operations of the device 1000. The operation station 1080 may include a controller 1082, a memory 1084, a display 1086 (e.g., monitor), and an input and output device 1088. The memory 1084 may include a nonvolatile memory, such as a flash memory, a phase-change random access memory (PRAM), a magneto-resistive RAM (MRAM), a resistive RAM (ReRAM), or a ferro-electric RAM (FRAM), and/or a volatile memory, such as a static RAM (SRAM), a dynamic RAM (DRAM), or a synchronous DRAM (SDRAM). The input and output device 1088 may be a keyboard or a touch screen.

The memory 1084 may store an operating system and may store recipe instructions that include settings (e.g., gas flow rates, temperature, time, power, pressure, etc.) for different manufacturing processes performed by the device 1000. The memory 1084 may store recipe instructions for forming a graphene product on the substrate 1040 according to one or more of the embodiments in FIG. 1A to 1C, 5A to 5C, or 6A to 6C of the present application.

The controller 1082 may be, a central processing unit (CPU), a controller, or an application-specific integrated circuit (ASIC), that when, executing recipe instructions stored in the memory 1084 (for one or more of the embodiments in FIG. 1A to 1C, 5A to 5C, or 6A to 6C) configures the controller 1082 as a special purpose controller that operates device 1000 to form a nanocrystalline graphene according to example embodiments on the substrate 1040.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:
1. A graphene product comprising:
a nanocrystalline graphene,
the nanocrystalline graphene including nano-sized crystals and having a ratio of carbon having an sp2 bonding structure to total carbon within a range of about 50% to about 99%, wherein
the nanocrystalline graphene includes hydrogen in an amount of about 1 at % to about 20 at %, and
the nanocrystalline graphene has a density of about 1.6 g/cc to about 2.1 g/cc.
2. The graphene product of claim 1, wherein a size of the nano-sized crystals ranges from about 0.5 nm to about 100 nm.
3. The graphene product of claim 1, wherein the nanocrystalline graphene is directly grown on a substrate at a temperature of about 700° C. or less through a plasma enhanced chemical vapor deposition process.
4. A graphene product comprising:
a nanocrystalline graphene,
the nanocrystalline graphene including nano-sized crystals and including hydrogen in an amount of about 1 at % to about 20 at %, wherein
the nanocrystalline graphene has a density of about 1.6 g/cc to about 2.1 g/cc.
5. The graphene product of claim 4, wherein a size of the nano-sized crystals ranges from about 0.5 nm to about 100 nm.
6. The graphene product of claim 4, wherein the nanocrystalline graphene is directly grown on a substrate at a temperature of about 700° C. or less through a plasma enhanced chemical vapor deposition process.
7. A graphene product comprising:
a nanocrystalline graphene,
the nanocrystalline graphene including nano-sized crystals having a size of about 0.5 nm to about 100 nm, the nanocrystalline graphene having a D-parameter of an Auger spectrum of carbon in a range of about 18 eV to 22.9 eV.

8. The graphene product of claim 7, wherein
the nanocrystalline graphene has a ratio of carbon having an sp2 bonding structure to total carbon within a range of about 50% to about 99%.

9. The graphene product of claim 7, wherein
the nanocrystalline graphene includes hydrogen in an amount of about 1 at % to about 20 at %.

10. The graphene product of claim 7, wherein the nanocrystalline graphene has a density of about 1.6 g/cc to about 2.1 g/cc.

11. The graphene product of claim 7, further comprising:
a substrate, wherein
the nanocrystalline graphene is directly on a surface of the substrate.

12. The graphene product of claim 11, wherein the substrate includes at least one of a group IV semiconductor material, a semiconductor compound having at least two elements, a metal, or an insulative material.

13. The graphene product of claim 11, wherein the substrate includes at least one of aluminum (Al), gold, (Au) antimony (Sb), arsenic (As), boron (B), cadmium (Cd), carbon (C), chromium (Cr), cobalt (Co), copper (Cu), gadolinium (Gd), gallium (Ga), germanium (Ge), hafnium (Hf), indium (In), manganese (Mn), molybdenum (Mo), nickel (Ni), nitrogen (N), phosphorus (P), ruthenium (Ru), selenium (Se), silicon (Si), sulfur (S), tellurium (Te), tungsten (W), titanium (Ti), tantalum (Ta), gold (Au), yttrium (Y), zinc (Zn), or zirconium (Zr).

14. The graphene product of claim 7, wherein the nanocrystalline graphene is directly grown on a substrate at a temperature of about 700° C. or less through a plasma enhanced chemical vapor deposition process.

15. The graphene product of claim 1, wherein
the ratio of carbon having the sp2 bonding structure to total carbon in the nanocrystalline graphene is within a range of 50% to 99%.

16. The graphene product of claim 8, wherein
the ratio of carbon having the sp2 bonding structure to total carbon in the nanocrystalline graphene is within a range of 50% to 99%.

* * * * *